(12) United States Patent
Watanabe et al.

(10) Patent No.: US 10,652,488 B2
(45) Date of Patent: May 12, 2020

(54) OPTICAL-DETECTION ELEMENT, SOLID-STATE IMAGING DEVICE, AND METHOD FOR DRIVING SOLID-STATE IMAGING DEVICE

(71) Applicants: BROOKMAN TECHNOLOGY, INC., Shizuoka (JP); IKEGAMI TSUSHINKI CO., LTD., Tokyo (JP); JAPAN ATOMIC ENERGY AGENCY, Ibaraki (JP)

(72) Inventors: Takashi Watanabe, Shizuoka (JP); Osamu Ozawa, Tokyo (JP); Kunihiko Tsuchiya, Ibaraki (JP); Tomoaki Takeuchi, Ibaraki (JP)

(73) Assignees: BROOKMAN TECHNOLOGY, INC., Shizuoka (JP); IKEGAMI TSUSHINKI CO., LTD., Tokyo (JP); JAPAN ATOMIC ENERGY AGENCY, Ibaraki (JP)

( * ) Notice: Subject to any disclaimer, the term of this patent is extended or adjusted under 35 U.S.C. 154(b) by 67 days.

(21) Appl. No.: 15/941,023

(22) Filed: Mar. 30, 2018

(65) Prior Publication Data
US 2018/0302581 A1   Oct. 18, 2018

(30) Foreign Application Priority Data
Apr. 12, 2017   (JP) .................................. 2017-78851

(51) Int. Cl.
*H04N 5/361*   (2011.01)
*H01L 27/146*   (2006.01)
(Continued)

(52) U.S. Cl.
CPC ......... *H04N 5/361* (2013.01); *H01L 27/1461* (2013.01); *H01L 27/1463* (2013.01); (Continued)

(58) Field of Classification Search
CPC .... H04N 5/361; H04N 5/3745; H04N 5/3765; H04N 5/378; H01L 27/14643; (Continued)

(56) References Cited

U.S. PATENT DOCUMENTS

| | | | |
|---|---|---|---|
| 9,923,006 B2 | 3/2018 | Watanabe et al. | |
| 2012/0193743 A1* | 8/2012 | Kawahito | ............. G01S 7/4816 257/435 |
| 2017/0133419 A1 | 5/2017 | Watanabe et al. | |

FOREIGN PATENT DOCUMENTS

WO   2016013227 A1   1/2016

* cited by examiner

*Primary Examiner* — Twyler L Haskins
*Assistant Examiner* — Angel L Garces-Rivera
(74) *Attorney, Agent, or Firm* — Metrolex IP Law Group, PLLC

(57) ABSTRACT

An optical-detection element includes a p-type supporting-layer, an n-type buried charge-generation region to implement a photodiode with the supporting-layer, a p-type shield region buried in the buried charge-generation region, a gate insulating-film contacted with the shield region, a transparent electrode on the gate insulating-film, a p-type well region buried in the supporting-layer, and an n+-type charge-readout region buried in the supporting-layer at an edge of the well region toward the buried charge-generation region.

12 Claims, 25 Drawing Sheets

(51) Int. Cl.
    *H04N 5/378*     (2011.01)
    *H04N 5/376*     (2011.01)
    *H04N 5/3745*    (2011.01)

(52) U.S. Cl.
    CPC .. *H01L 27/14607* (2013.01); *H01L 27/14614* (2013.01); *H01L 27/14623* (2013.01); *H01L 27/14643* (2013.01); *H04N 5/378* (2013.01); *H04N 5/3745* (2013.01); *H04N 5/3765* (2013.01); *H01L 27/14683* (2013.01)

(58) Field of Classification Search
    CPC ........... H01L 27/1463; H01L 27/14607; H01L 27/14614; H01L 27/14623; H01L 27/1461; H01L 27/14683
    See application file for complete search history.

DURING STORAGE

DURING RESET / SIGNAL DETECTION

DURING RESET AND SIGNAL DETECTION

DURING CHARGE STORAGE

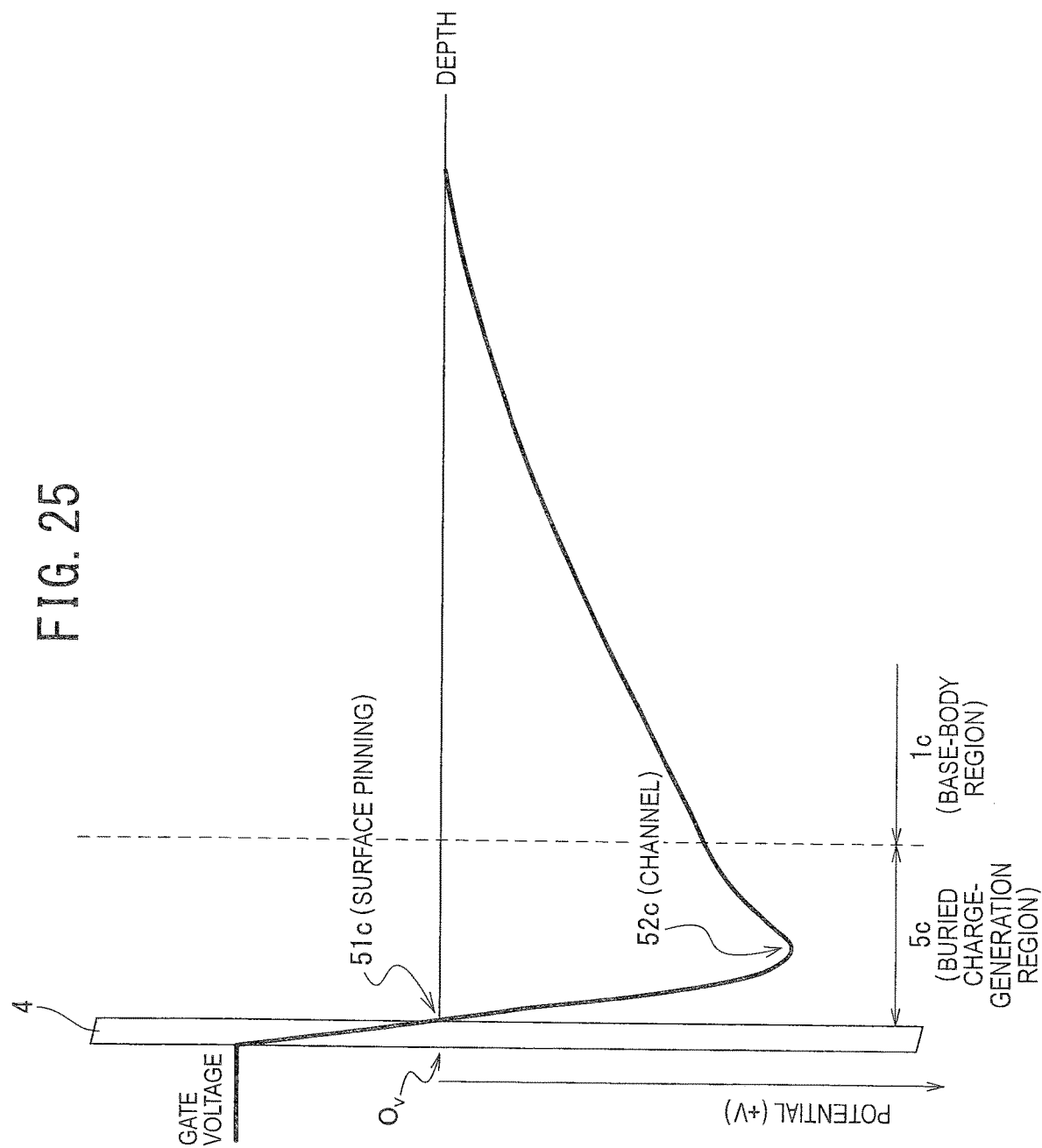

DURING RESET AND SIGNAL DETECTION

DURING CHARGE STORAGE

OPTICAL-DETECTION ELEMENT, SOLID-STATE IMAGING DEVICE, AND METHOD FOR DRIVING SOLID-STATE IMAGING DEVICE

CROSS-REFERENCE TO RELATED APPLICATIONS

This application claims priority to Japanese Patent Application No. 2017-078851, filed Apr. 12, 2017. The contents of this application are incorporated herein by reference in its entirety.

BACKGROUND OF THE INVENTION

1. Field of the Invention

The present invention relates to an optical-detection element having radiation immunity, a solid-state imaging device in which a plurality of optical-detection elements is arranged, and a method for driving the solid-state imaging device.

2. Description of the Related Art

WO 2016/013227 discloses a specific transparent electrode for a gate electrode of a MOS structure, which serves as a photo-electric converter (hereinafter, the photo-electric converter is referred as a "photogate") in a pixel used for a radiation tolerant solid-state imaging device. The photogate includes an n-type buried charge-generation region buried in an upper portion of a p-type supporting-layer. The transparent electrode is provided on the buried charge-generation region via an insulating-film. A channel is formed in the buried charge-generation region.

In the solid-state imaging device (the photogate image sensor) having the photogate, which is disclosed in WO 2016/013227, charges generated by photo-electric conversion in the photogate are accumulated in a charge-readout region (a charge-detection portion) buried adjacent to the buried charge-generation region, and a potential change in the charge-readout region is read out as a signal. When the signal charges are electrons, a pinning operation by holes is carried out in order to suppress a generation of a dark current in the photogate. In the pinning operation, to deactivate a surface of a semiconductor layer, the surface is filled by holes of minority carriers. In the invention disclosed in WO 2016/013227, a fixed negative voltage is constantly applied to the transparent electrode implementing the photogate for achieving the pinning operation. In addition, the potential in the charge-readout region, serving as a drain in the photogate, is required to be kept at a sufficiently high positive voltage in order to ensure a charge-detection operating-margin in the solid-state imaging device.

The inventors of the present invention found out that, when the photogate image sensor is driven, while the surface potential is constantly pinned under the above-described conditions, a significantly strong electric field is caused at a boundary between the charge-readout region and the photogate to generate a large dark current.

SUMMARY OF THE INVENTION

In view of the foregoing problem, an object of the present invention is to provide an optical-detection element having radiation immunity capable of capturing images with a high sensitivity and a wide dynamic range, while minimizing an electric field concentration in a charge-readout region to suppress a generation of a dark current, a solid-state imaging device using the optical-detection element as a pixel, and a method for driving the solid-state imaging device.

In order to attain the object, a first aspect of the present invention inheres in an optical-detection element encompassing (a) a supporting-layer of a first conductivity type, (b) a buried charge-generation region of a second conductivity type buried in an upper portion of the supporting-layer to implement a photodiode with the supporting-layer, (c) a shield region of the first conductivity type having a higher impurity concentration than the supporting-layer and buried at an upper surface of the buried charge-generation region, (d) a gate insulating-film contacted with an upper surface of the shield region, (e) a transparent electrode provided on the gate insulating-film, (f) a well region of the first conductivity type having a higher impurity concentration than the supporting-layer and buried in the upper portion of the supporting-layer, and (g) a charge-readout region of the second conductivity type having a higher impurity concentration than the buried charge-generation region and buried in the upper portion of the supporting-layer at an edge of the well region toward the buried charge-generation region. The shield region according to the first aspect of the present invention is occasionally referred to as a "virtual electrode" in an optical-detection element having a structure other than a photogate structure. Thus, conventionally, an arrangement of a transparent electrode on such a virtual electrode was considered inappropriate according to technical common knowledge in the art. In contrast to the technical common knowledge in the art that in which an arrangement of the shield region and the transparent electrode on the upper surface of the buried charge-generation region is inappropriate, the optical-detection element according to the first aspect employs the shield region and the transparent electrode to exert an electrostatic potential induced by a potential of the transparent electrode on the surface of the shield region via the gate insulating-film, so that a surface potential of the shield region can be pinned by charges of the first conductivity type.

A second aspect of the present invention inheres in a solid-state imaging device in which a plurality of pixels is arranged, each pixel corresponding to the optical-detection element according to the first aspect. Thus, the solid-state imaging device according to the second aspect can also exert, in each of the pixels, an electrostatic potential induced by a potential of the transparent electrode on the surface of the shield region via the gate insulating-film, so that a surface potential of the shield region can be pinned by charges of the first conductivity type.

A third aspect of the present invention inheres in a method for driving a solid-state imaging device in which a plurality of pixels each having a photogate structure is arranged, so as to solve the conventional problem described above. In the method for driving the solid-state imaging device according to the third aspect, a first voltage for pinning charges having reverse polarity reverse to signal charges and a second voltage shifted from the first voltage in a direction in which a channel potential of a buried charge-generation region deepens, are applied to a transparent electrode implementing the photogate structure in each of the pixels at a timing of each of divided periods of one frame, so as to suppress electric field concentration in a charge-readout region in each of the pixels having the photogate structure.

BRIEF DESCRIPTION OF DRAWINGS

FIG. 25 is a diagram for describing a potential profile in a depth direction in a photogate of the optical-detection element according to the fifth embodiment;

DESCRIPTION OF THE EMBODIMENTS

Figure 1:
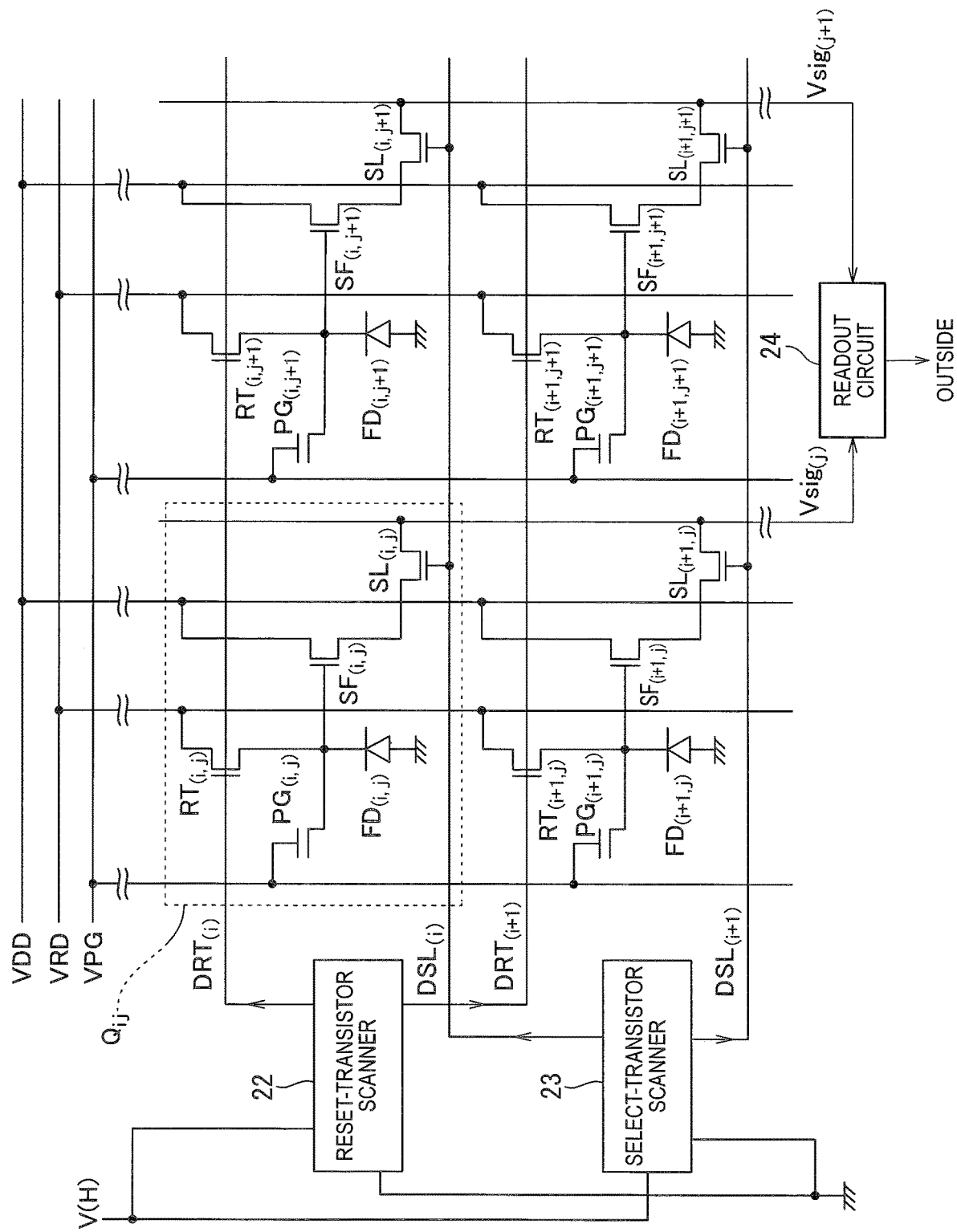
FIG. 1 is a circuit diagram illustrating a schematic structure of an entire photogate image sensor according to a first embodiment of the present invention.

Hereinafter, first to sixth embodiments of the present invention will be described with reference to the Drawings. Note that, in the following description of the Drawings, the same or similar reference numerals denote the same or similar elements and portions. In addition, it should be noted that the Drawings are schematic and the relationship between thickness and planar dimensions, the ratios of dimensions, and the like are different from actual ones. Therefore, specific thicknesses and dimensions should be determined in consideration of the following description. Moreover, the Drawings also include portions having different dimensional relationships and ratios from each other.

The following first to sixth embodiments each illustrate a device or method embodying the technical ideas of the present invention. The technical ideas of the present invention are not intended to be limited to the following materials, shapes, structures, or arrangements of the respective elements described below. Various modifications will be apparent to those skilled in the art within the technical ideas of the present invention. Moreover, in the following description, the directions "left-right" and "up-down" are definitions used for the sake of convenience, and such definitions do not limit the technical ideas of the present invention. Thus, for example, when the orientation of the paper is rotated by 90 degrees, "left-right" and "up-down" shall be read mutually exchanged. When the paper is rotated by 180 degrees, naturally, "the left" is changed to "the right" and "the right" is changed to "the left".

It is apparent to those skilled in the art that a region or layer provided with a mark "n" or "p" in the Drawings denotes a polarity of element made of a semiconductor such as a semiconductor region or semiconductor layer. The superscript "+" added to the mark "n" or "p" denotes that the corresponding semiconductor region has a higher impurity concentration than a region without the superscript "+"

added, and the superscript "−" added to the mark "n" or "p" denotes that the corresponding semiconductor region has a lower impurity concentration than a region without the superscript "−" added.

First Embodiment

As illustrated in FIG. 1, a photogate image sensor according to a first embodiment of the present invention includes a pixel area in which a plurality of photogate-pixels (optical-detection elements) $Q_{ij}$ is arranged in a matrix form, and a peripheral circuit including a reset-transistor scanner 22, a select-transistor scanner 23, and a readout circuit 24 disposed at the periphery of the pixel area.

Figure 2:
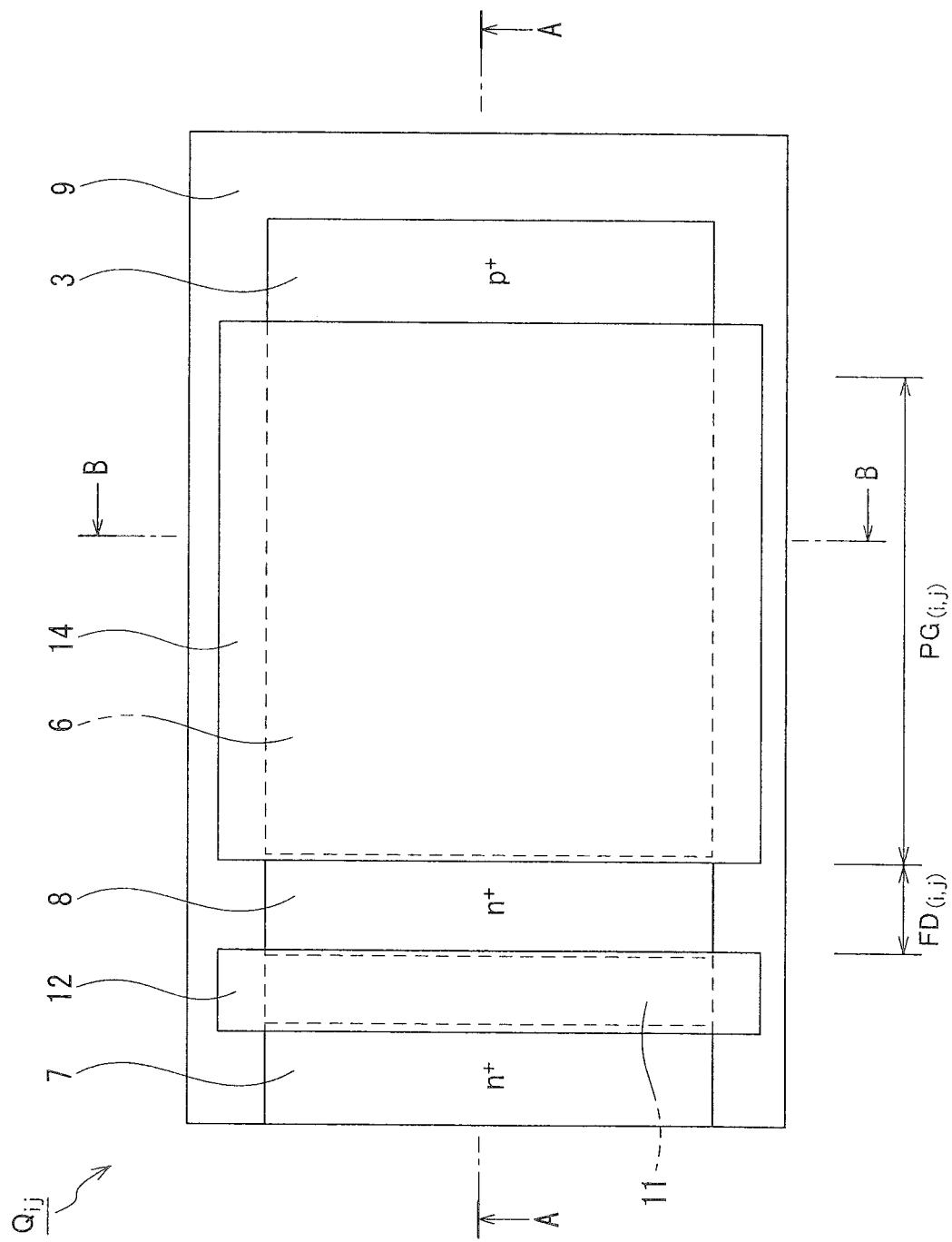
FIG. 2 is a schematic plan view illustrating an optical-detection element of one pixel included in the photogate image sensor according to the first embodiment.
Figure 3A:
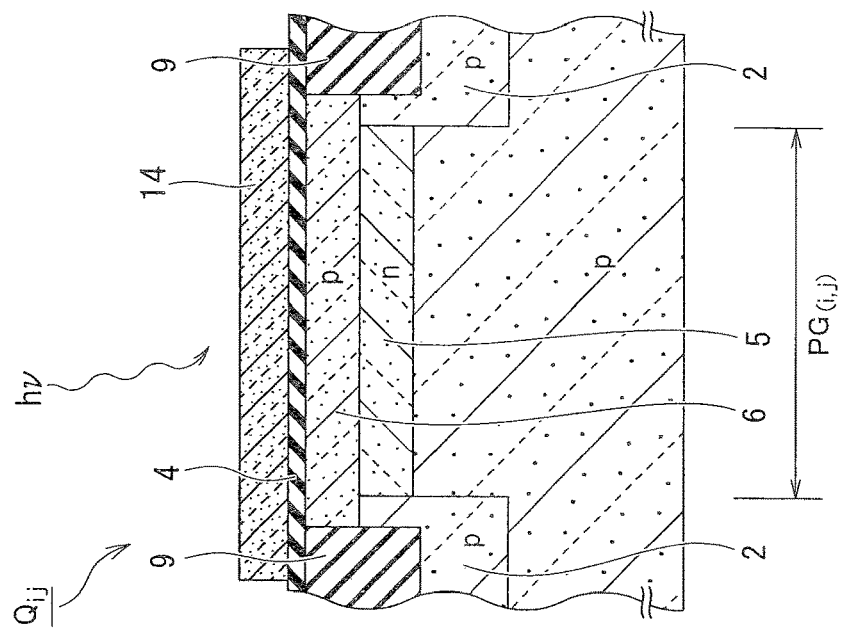
FIG. 3A is a cross-sectional view of the optical-detection element taken from the direction A-A in FIG. 2.
Figure 3B:
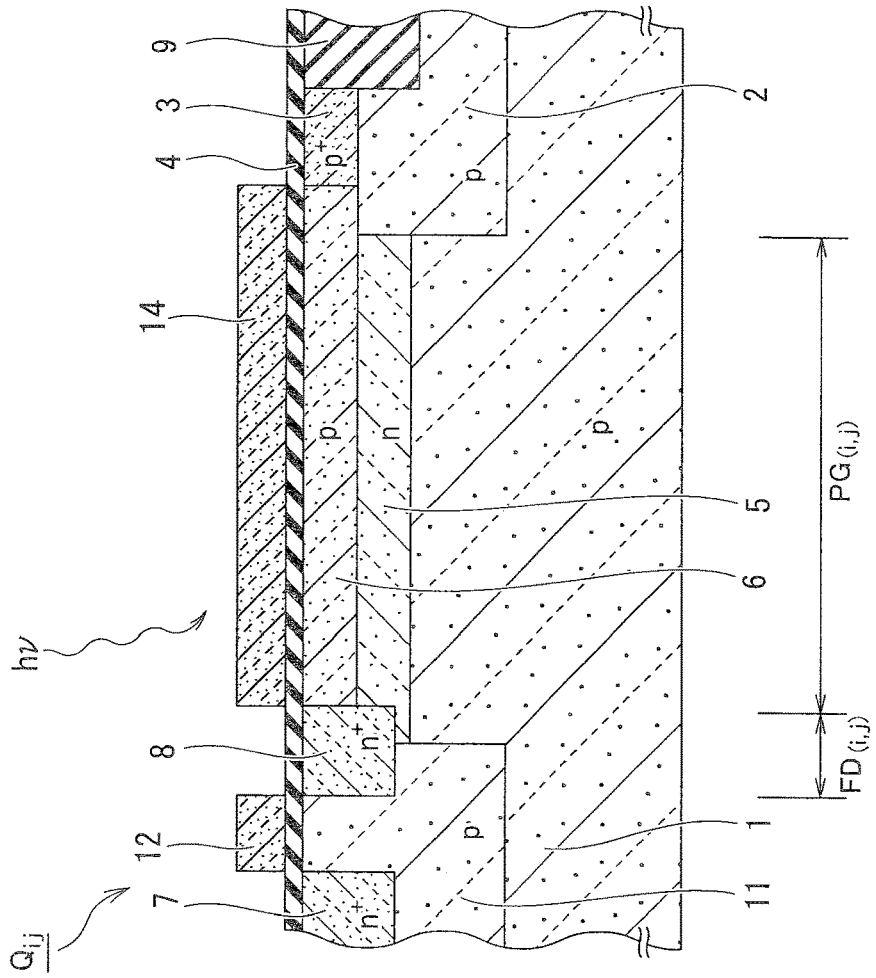
FIG. 3B is a cross-sectional view of the optical-detection element taken from the direction B-B in FIG. 2.

As illustrated in FIGS. 2, 3A, and 3B, the pixel $Q_{ij}$ according to the first embodiment is an optical-detection element having a photogate structure including a supporting-layer 1 of a first conductivity type (p-type), a buried charge-generation region 5 of a second conductivity type (n-type) buried in an upper portion of the supporting-layer 1 to implement a photodiode with the supporting-layer 1, a p-type shield region 6 having a higher impurity concentration than the supporting-layer 1 and provided on an upper surface of the buried charge-generation region 5, a gate insulating-film 4 contacted with an upper surface of the shield region 6, and a transparent electrode 14 provided on the gate insulating-film 4. The shield region 6 is occasionally referred to as "a virtual electrode" in an optical-detection element having a structure other than the photogate structure, and an arrangement of the transparent electrode 14 on such a virtual electrode does not follow the technical common knowledge in the art. Thus, in earlier technology, an arrangement of the p-type shield region 6 on the upper surface of the buried charge-generation region 5 shall be considered inappropriate for the photogate structure.

In contrast to the conventional technical common knowledge, the pixel $Q_{ij}$ of the first embodiment uses positively the shield region 6 in the photogate structure, such that the pixel $Q_{ij}$ further includes a p-type well region 11, which has a higher impurity concentration than the supporting-layer 1 and is buried in the upper portion of the supporting-layer 1. An n$^+$-type charge-readout region 8 having a higher impurity concentration than the buried charge-generation region 5 is buried at an edge of the well region 11 and in contact with the buried charge-generation region 5 and the shield region 6. An n$^+$-type reset-drain region 7 having a higher impurity concentration than the buried charge-generation region 5 is also buried in the upper portion of the well region 11 separately from the charge-readout region 8. The pixel $Q_{ij}$ according to the first embodiment further includes a reset-gate electrode 12 stacked on the gate insulating-film 4 and allocated above the well region 11 between the charge-readout region 8 and the reset-drain region 7.

A photogate $PG_{(i, j)}$ of the pixel $Q_{ij}$ according to the first embodiment corresponds to a region in which the transparent region 14 is allocated immediately above the buried charge-generation region 5 and the shield region 6 via the thin gate insulating-film 4.

The transparent electrode 14 may be made of a material transparent to a wavelength of light hv incident on the photogate $PG_{(i, j)}$. When the transparent electrode 14 is formed using a polycrystalline silicon (hereinafter, referred to as a "doped-polysilicon (DOPOS)") film doped with n-type impurity atoms such as phosphor (P) or arsenic (As), from the viewpoint of the manufacturing process, the use of DOPOS film is convenient, because the boundary between the transparent electrode 14 and the charge-readout region 8 can be self-aligned. Instead of the DOPOS film, an oxide thin film including a transparent conductive oxide such as tin oxide ($SnO_2$), indium (In)-doped tin oxide (ITO), aluminum (Al)-doped zinc oxides (AZO), gallium (Ga)-doped zinc oxide (GZO), or indium (In)-doped zinc oxide (IZO) may be used.

When the DOPOS film doped with an impurity of the second conductivity type is used for the reset-gate electrode 12, from the viewpoint of the manufacturing process, the use of DOPOS film is also convenient, because the boundary between the reset-gate electrode 12 and the charge-readout region 8 and the boundary between the reset-gate electrode 12 and the reset-drain region 7 can be self-aligned; however, any other film may be used instead of the DOPOS film.

The optical-detection element is not limited to a simple MOS transistor in which a silicon oxide film is used as the gate insulating-film 4. That is, the optical-detection element may be implemented by MIS transistors, in which a single-layer film of at least one of a strontium oxide (SrO) film, a silicon nitride ($Si_3N_4$) film, an aluminum oxide ($Al_2O_3$) film, a magnesium oxide film (MgO) film, a yttrium oxide ($Y_2O_3$) film, a hafnium oxide ($HfO_2$) film, a zirconium oxide ($ZrO_2$) film, a tantalum oxide ($Ta_2O_5$) film, and a bismuth oxide ($Bi_2O_3$) film other than the silicon oxide film or a composite film obtained by stacking a plurality of these films is used as the gate insulating-film 4. However, these gate insulating-film materials need to have radiation immune characteristics.

FIGS. 3A and 3B illustrate a case in which a p-type semiconductor substrate (Si substrate) is used as the "supporting-layer 1". However, a p-type epitaxial growth layer having a lower impurity concentration than the p-type semiconductor substrate may be grown on the semiconductor substrate and the epitaxial growth layer may be used as the supporting-layer 1 instead of the semiconductor substrate. Alternatively, a p-type epitaxial growth layer may be grown on the n-type semiconductor substrate and the epitaxial growth layer may be used as the supporting-layer 1. Alternatively, a p-type SOI semiconductor layer is used as the supporting-layer 1 so as to form a silicon on insulator (SOI) structure.

As illustrated in FIG. 2, the pixel $Q_{ij}$ according to the first embodiment may be designed to have a rectangular shape in a planar pattern, for example. FIG. 2 illustrates an upper surface of the pixel $Q_{ij}$ when the gate insulating-film 4 is omitted. The pixel $Q_{ij}$ has a photogate structure implemented by a p$^+$-type joint-region 3, the transparent electrode 14, the n$^+$-type charge-readout region 8, the reset-gate electrode 12, and the n$^+$-type reset-drain region 7 arranged from the right to the left in the right-left direction in FIG. 2. FIG. 2 omits an amplification-transistor $SF_{(i, j)}$ and a select-transistor $SL_{(i,j)}$ illustrated in FIG. 1.

As illustrated in FIGS. 3A and 3B, a p-type buried pixel-isolation region 2 is buried in the upper portion of the supporting-layer 1 so as to surround the pixel $Q_{ij}$. An element-isolation insulating-film 9 is buried in an upper portion of the buried pixel-isolation region 2 so as to isolate the respective pixels $Q_{ij}$ from each other. The buried pixel-isolation region 2 is located between the buried charge-generation region 5 and the element-isolation insulating-film 9. The p$^+$-type joint-region 3 having a higher impurity concentration than the buried pixel-isolation region 2 is buried in a part of the upper portion of the buried pixel-isolation region 2 between the shield region 6 and the element-isolation insulating-film 9 and in contact with the gate insulating-film 4. The joint-region 3 is electrically connected to the p-type buried pixel-isolation region 2. That is, the shield region 6 at the end on the right side is electrically connected to the p-type buried pixel-isolation region 2 via the p$^+$-type joint-region 3. Accordingly, the end of the p-type shield region 6 is electrically short-circuited by the p-type supporting-layer 1 via the p$^+$-type joint-region 3 to have a ground potential.

As illustrated on the left sides of FIGS. 2 and 3A, the p-type well region 11 having the same impurity concentration as the buried pixel-isolation region 2 is buried in the upper portion of the supporting-layer 1 in the pixel $Q_{ij}$ at the same depth as the buried pixel-isolation region 2. The n-type reset-drain region 7 having a higher impurity concentration than the buried charge-generation region 5 is buried in a part of the upper portion of the well region 11 and in contact with the gate insulating-film 4. The p-type well region 11 and the p-type buried pixel-isolation region 2 may be buried as a common region by the same process. The p-type well region 11 and the p-type buried pixel-isolation region 2 merged into a common region may serve as a "pixel-isolation region". The p-type buried pixel-isolation region 2 and the p-type well region 11 are not necessarily buried at the same depth or do not necessarily have the same impurity concentration, but are preferably buried at the same depth and preferably have the same impurity concentration; otherwise the manufacturing process is complicated.

As illustrated in FIG. 3A, the n$^+$-type charge-readout region 8 having a higher impurity concentration than the buried charge-generation region 5 is buried in the region at the boundary between the well region 11 and the buried charge-generation region 5 and in contact with the gate insulating-film 4. The reset-gate electrode 12 is stacked on the gate insulating-film 4 and allocated above the well region 11 between the reset-drain region 7 and the charge-readout region 8 so as to implement a reset-transistor $RT_{(i, j)}$ having a structure equivalent to an nMOS transistor. The reset-transistor $RT_{(i, j)}$ applies a higher-level voltage to the reset-gate electrode 12 to exhaust charges of the charge-readout region 8 to the reset-drain region 7.

The pixel $Q_{ij}$ according to the first embodiment is illustrated in a representation of equivalent circuit in a region of (i-row)×(j-column) surrounded by the dotted line as a part of the matrix in FIG. 1. The pixel $Q_{ij}$ has a structure implemented by the photogate $PG_{(i,j)}$, a charge-detection portion $FD_{(i,j)}$ provided adjacent to the photogate $PG_{(i,j)}$, the reset-transistor $RT_{(i,j)}$ which resets a potential of the charge-detection portion $FD_{(i, j)}$, the amplification-transistor $SF_{(i, j)}$ which amplifies a potential change of the charge-detection portion $FD_{(i,j)}$, and the select-transistor $SL_{(i,j)}$ which selects an output of the amplification-transistor $SF_{(i,j)}$, (i=1 to m; j=1 to n:m and n are each a positive integer of 2 or greater). Although FIG. 1 illustrates simplified four pixels $Q_{ij}$ for illustration purposes, the present embodiment is not limited to the 2×2 matrix pattern. An arbitrary number of pixels can be arranged in a two-dimensional matrix depending on design requirements so as to have an m×n matrix pattern (min=approximately 300 to 10000 and n=approximately 200 to 8000).

The m-number reset drive-lines corresponding to the m-number rows in the matrix are distributed from the reset-transistor scanner 22. For example, the reset drive-lines $DRT_{(i)}$ and $DRT_{(i+)}$ are connected to the gates of the reset-transistors $RT_{(i,j)}$ and $RT_{(i+1, j)}$ in the pixels $Q_{ij}$ and $Q_{i+1, j}$ belonging in the i-th and (i+1)-th rows, respectively, in the matrix. The reset-transistor scanner 22 controls, in units of rows, voltages applied to the reset-transistors $RT_{(i,j)}$ and $RT_{(i+1, j)}$ in the pixels $Q_{ij}$ and $Q_{i+1, j}$ belonging in the i-th and (i+j)-th rows via the reset drive-lines $DRT_{(i)}$ and $DRT_{(i+1)}$ in the i-th and (i+j)-th rows. Although not illustrated in FIG. 1, voltages applied to reset-transistors belonging in other rows, such as (i−1)-th and (i+2)-th rows in the matrix, are also controlled in units of rows. A higher-level voltage V (H) of the reset-transistor scanner 22 used may be a typical power-supply voltage, for example. As a lower-level voltage of the reset-transistor scanner 22, a ground voltage can be used, for example.

The m-number of selection drive-lines corresponding to the m-number of rows in the matrix are distributed respectively from the select-transistor scanner 23. For example, the selection drive-lines $DSL_{(i)}$ and $DSL_{(i+1)}$ are connected to the gates of the select-transistors $SL_{(i,j)}$ and $SL_{(i+1,j)}$ in the pixels $Q_{ij}$ and $Q_{i+1, j}$ belonging in the i-th and (i+j)-th rows, respectively, in the matrix. The select-transistor scanner 23 controls, in units of rows, voltages applied to the select-transistors $SL_{(i, j)}$ and $SL_{(i+1,j)}$ in the pixels $Q_{ij}$ and $Q_{i+1,j}$ belonging in the i-th and (i+j)-th rows via the selection drive-lines $DSL_{(i)}$ and $DSL_{(i+1)}$ in the i-th and (i+j)-th rows. Although not illustrated in FIG. 1, voltages applied to select-transistors belonging in other rows, such as (i−1)-th and (i+2)-th rows in the matrix, are also controlled in units of rows. Like the reset-transistor scanner 22, a higher-level voltage V (H) used in the select-transistor scanner 23 may be assigned to an output voltage of a typical power-supply, for example. A lower-level voltage of the select-transistor scanner 23 may be assigned to a ground voltage, for example.

The drain of the reset-transistor $RT_{(i,j)}$ is connected to a voltage supply-line so that a reset-drain voltage VRD of a DC voltage can be applied to the reset-transistor $RT_{(i, j)}$. The drain of the amplification-transistor $SF_{(i, j)}$ is connected to a voltage supply-line so that an amplification drain voltage VDD of a DC voltage can be applied to the amplification-transistor $SF_{(i,j)}$. The source of the photogate $PG_{(i,j)}$, the source of the reset-transistor $RT_{(i, j)}$, and the gate of the amplification-transistor $SF_{(i, j)}$ are connected together, and the cathode of the charge-detection portion $FD_{(i, j)}$ indicated as a diode in the equivalent circuit is connected to the connection point of the photogate $PG_{(i, j)}$, the reset-transistor $RT_{(i,j)}$, and the amplification-transistor $SF_{(i,j)}$. The anode of the charge-detection portion $FD_{(i, j)}$ of the diode is grounded. There is no drain side of the photogate $PG_{(i, j)}$.

The source of the amplification-transistor $SF_{(i,j)}$ is connected to the drain of the select-transistor $SL_{(i,j)}$. The select-transistors $SL_{(i,j)}$ and $SL_{(i+1,j)}$ on the source side are provided with an output signal-line $V_{sig(j)}$ connected to the readout circuit 24. An output signal of the selected pixel $Q_{ij}$ or $Q_{i+1,j}$ is transmitted to the readout circuit 24 via the output signal-line $V_{sig(j)}$. Similarly, the select-transistors $SL_{(i,j+1)}$ and $SL_{(i+1,j+1)}$ on the source side are provided with an output signal-line $V_{sig(j+1)}$ connected to the readout circuit 24. An output signal of the selected pixel $Q_{i,j+1}$ or $Q_{i+1,j+1}$ is transmitted to the readout circuit 24 via the output signal-line $V_{sig(j+1)}$. The transmitted signals are subjected to predetermined processing in the readout circuit 24, and the processed output signals are finally sent to the outside of a semiconductor chip.

Figure 4:
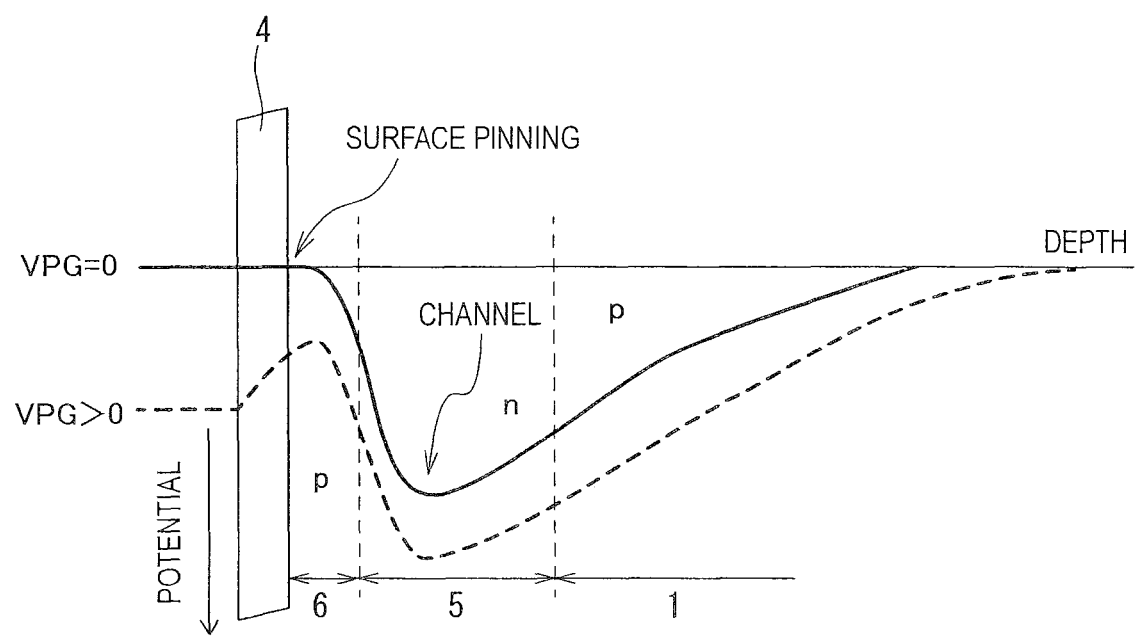
FIG. 4 is a diagram for describing a potential profile in a depth direction in a photogate of the optical-detection element according to the first embodiment.

In the pixel $Q_{ij}$ according to the first embodiment, the signal charges generated by photo-electric conversion in the photogate $PG_{(i,j)}$ during a storage period are read out from the charge-readout region 8 during a readout period. In the pixel $Q_{ij}$ according to the first embodiment, a photogate voltage VPG of a constant value (DC) approximate to zero volt is applied to the transparent electrode 14, so that the surface potential of the shield region 6 is pinned by holes of majority carriers in the shield region 6 allocated immediately below the gate insulating-film 4, which is shown in FIG. 4. That is, when the shield region 6 is a p-type, the surface potential of the shield region 6 is pinned by the holes of the majority carriers in the shield region 6 allocated immediately below the transparent electrode 14, so that the interface states at the interface between the gate insulating-film 4 and the shield region 6 are deactivated.

As used herein, the phrase "voltage approximate to zero volt" means a span of voltages encompassing a slightly shifted value from zero volt in the negative direction or the positive direction, since a voltage when the surface of the p-type shield region 6 is filled with the holes practically fulfills flat band conditions, and the gate voltage under the flat band conditions depends on the impurity concentration of the shield region 6, the material of the transparent electrode 14, the charges in the gate insulating-film 4, and the like. Accordingly, electric field concentration between the charge-detection portion $FD_{(i,j)}$ and the photogate $PG_{(i,j)}$ is suppressed even when the potential of the charge-readout region 8 is set at a high value, so as to suppress a generation of a dark current, ensure a radiation-tolerant performance, and sufficiently ensure a signal detection margin.

As indicated by the curved broken line in FIG. 4, when the photogate voltage VPG applied to the transparent electrode 14 is a positive value (VPG>zero volt), the shield region 6 is depleted. When the photogate voltage VPG applied to the transparent electrode 14 is zero volt (VPG=zero volt) as indicated by the curved solid line in FIG. 4, the surface potential of the p-type shield region 6 is pinned by majority carriers (holes) by electrostatic potentials induced by the potential of the transparent electrode 14 on the surfaces of the buried charge-generation region 5 and the shield region 6 via the gate insulating-film 4. A channel potential of the buried charge-generation region 5 is shallower than the case in which the photogate voltage VPG is a positive value, but has a depth sufficient to hold the charges, as illustrated in FIG. 4. The interface states at the semiconductor surface are increased by irradiation of gamma rays but deactivated because the surface is filled with a large number of holes when the photogate voltage VPG is zero volt, so as to suppress an increase in dark current.

When the gamma rays are irradiated to the semiconductor element, a large number of electron-hole pairs are generated in an oxide film on the semiconductor surface, and therefore, slow holes remain and positive charges concentrate in the oxide film on the semiconductor surface. As a result, the semiconductor surface is depleted to cause a large dark current. As the interface states at the semiconductor interface is greater, a larger dark current is generated. In contrast, as illustrated in FIGS. 3A and 3B, only the thin gate insulating-film 4 having a thickness of approximately 4 nm to 10 nm is present above the buried charge-generation region 5, and an absolute quantity of the holes generated in the gate insulating-film 4 is small, as compared with a regular p-n junction photo-electric converter in which a thick oxide film is provided on a semiconductor surface. Further, in association with the deactivation of the interface states described above, the radiation hardening is greatly improved.

Figure 5:
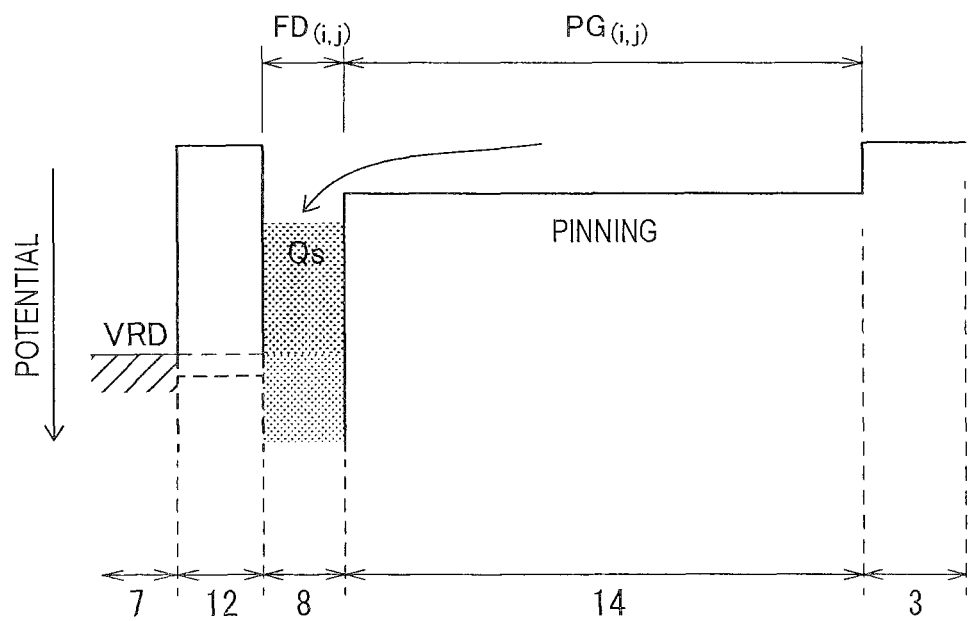
FIG. 5 is a potential profile illustrating an operation of the optical-detection element according to the first embodiment.

FIG. 5 is a potential profile illustrating the operation of the pixel $Q_{ij}$ according to the first embodiment. The photogate voltage VPG of the constant value (DC) approximate to zero volt is applied to the transparent electrode 14 so that the surface potential of the p-type shield region 6 is pinned by majority carriers (holes). When the reset-drain voltage VRD is sufficiently deeper than the channel potential upon the pinning, the signal charges (electrons) photo-electrically converted by the photogate $PG_{(i,j)}$ can constantly be transferred to the charge-readout region 8, and the signal charges are thus not accumulated in the photogate $PG_{(i,j)}$. Accordingly, it is possible to decrease the capacitance of the charge-detection portion $FD_{(i,j)}$ during the charge readout and to increase the charge voltage conversion gain, so as to achieve higher-level voltage-sensitivity.

Figure 6:
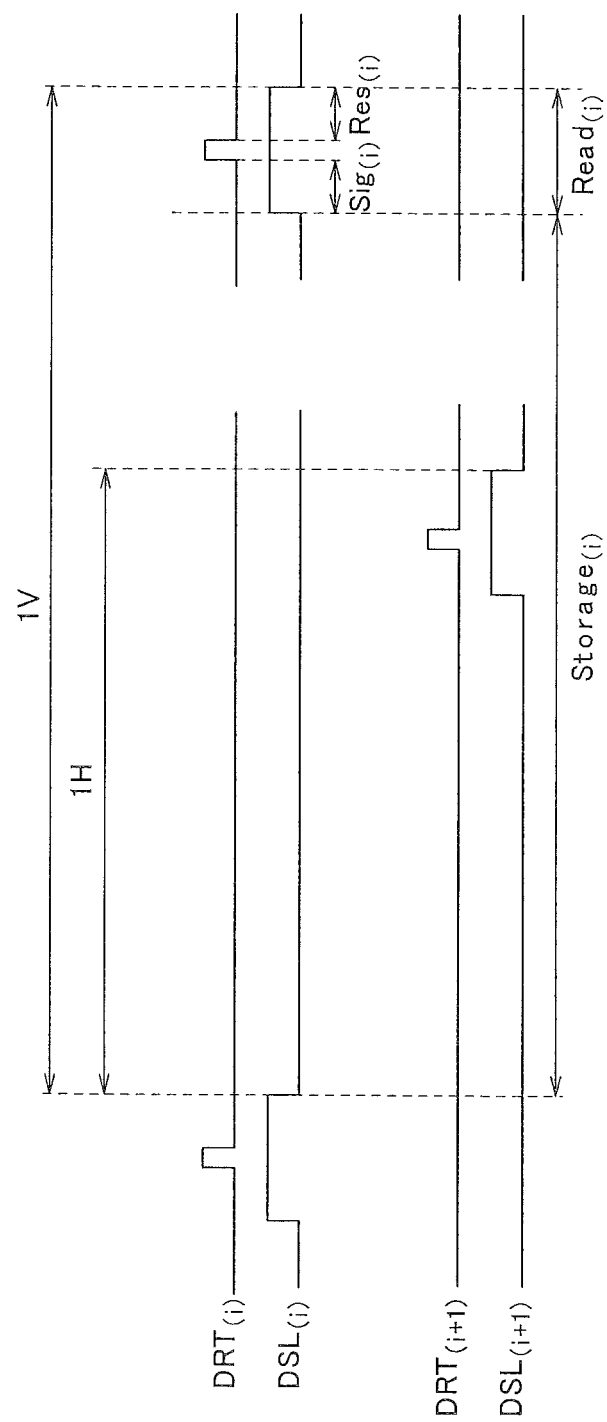
FIG. 6 is a chart for describing a drive timing of the photogate image sensor according to the first embodiment.

FIG. 6 is a timing chart illustrating a drive timing focusing on the reset drive-lines $DRT_{(i)}$ and $DRT_{(i+1)}$ and the selection drive-lines $DSL_{(i)}$ and $DSL_{(i+1)}$ in the i-th and (i+1)-th rows, among the drive-lines extending in the horizontal direction in FIG. 1. The symbol "1H" represents a row-readout period, and the symbol "1V" represents a frame-readout period, on the assumption that the readout operation is carried out in order of row by row.

In the pixel $Q_{ij}$ in the i-th row, a photo-electric conversion and storage operation is carried out in the storage period Storage(i). Although not illustrated in FIG. 6, the photogate voltage VPG of the constant value (DC) approximate to zero volt is applied to the transparent electrode 14 in the respective pixels $Q_{ij}$ in the storage period Storage(i) so that the semiconductor surface is pinned.

Subsequently, in the pixel $Q_{ij}$ in the i-th row, the photogate voltage VPG of the constant value (DC) approximate to zero volt is applied to the transparent electrode 14 in the respective pixels $Q_{ij}$ in the readout period Read(i) continued from the storage period Storage(i) so that the semiconductor surface is pinned, although not illustrated in FIG. 6. The selection drive-line $DSL_{(i)}$ of the select-transistor scanner 23 is shifted to a higher-level voltage in the readout period, so that the pixel signal is read out to the output line. When the reset drive-line $DRT_{(i)}$ of the reset-transistor scanner 22 is shifted to a higher-level voltage at the intermediate stage of the readout period, the charge-readout region 8 is reset.

Immediately before the reset operation, a signal $Sig_{(i)}$ of the signal charges having been accumulated in the charge-detection portion $FD_{(i,j)}$ is read out from the charge-readout region 8. Immediately after the reset operation, a signal $Res_{(i)}$ at a reset level in which the signal charges of the charge-detection portion $FD_{(i,j)}$ are exhausted is read out from the charge-readout region 8. The signals are then subjected to correlated double sampling (CDS) in the read out circuit 24 which reads a difference between the signal $Sig_{(i)}$ of the signal charges accumulated and the signal $Res_{(i)}$ at the reset level, so as to obtain net signals in which threshold variation of the amplification-transistor $SF_{(i,j)}$ or the like is removed.

Thereafter, the same operation as in the i-th row is repeated sequentially in the (i+1)-th row, the (i+2)-th row, the (i+3)-th row, . . . per horizontal scanning period in the time direction, so as to carry out the readout operation for the entire pixel area in the photogate image sensor. The potential difference between the charge-readout region 8 and photogate $PG_{(i,j)}$ is kept at a small value in each row, so as to prevent electric field concentration.

Comparative Example

Figure 7:
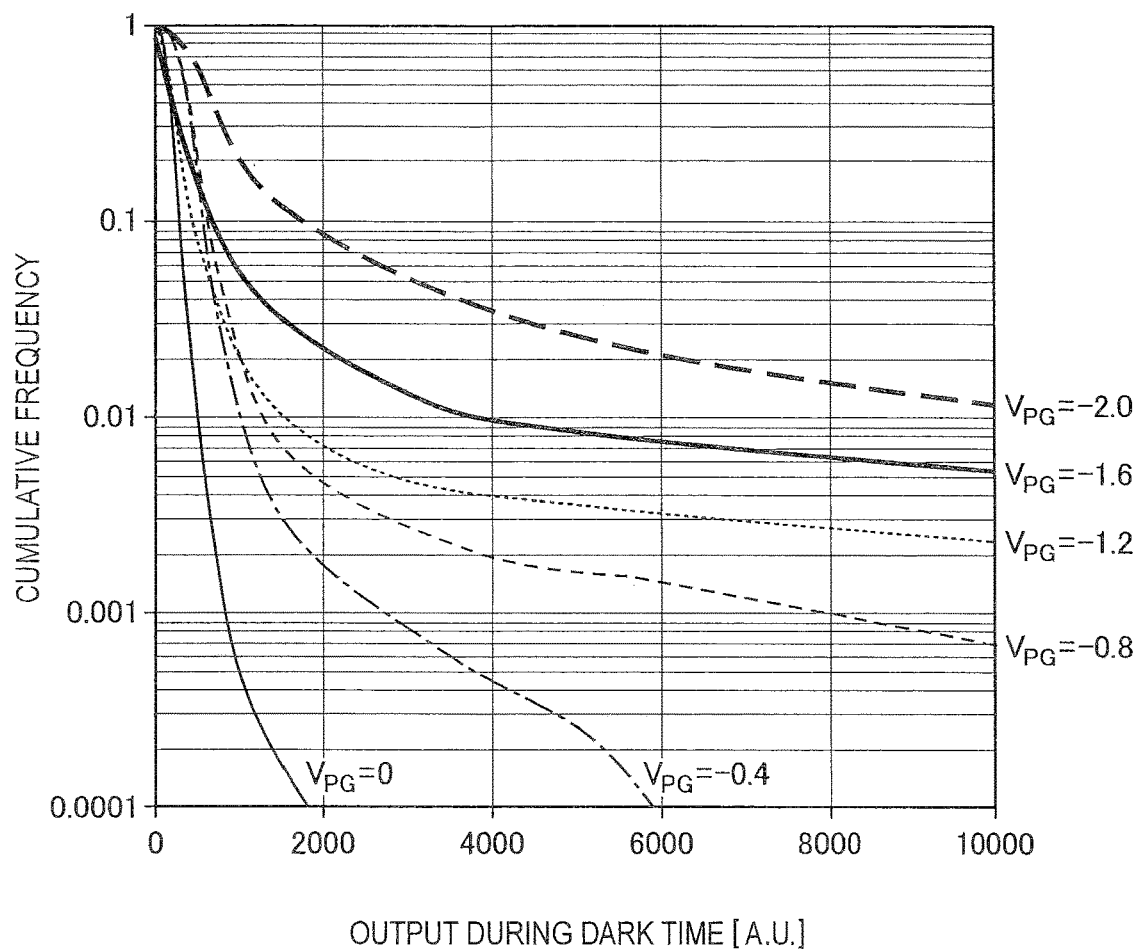
FIG. 7 is a diagram illustrating a change in dark current at a plurality of photogate voltages using a cumulative frequency distribution in a photogate image sensor according to a comparative example.
Figure 8:
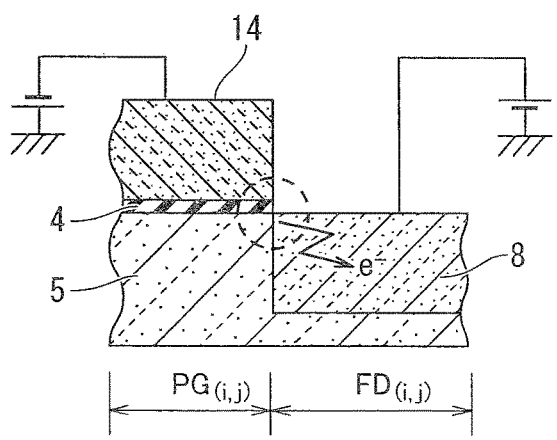
FIG. 8 is a schematic view illustrating a phenomenon in which an excessive dark current is generated at a boundary between a photogate and a charge-detection portion in the photogate image sensor according to the comparative example.

A comparative example is described below with reference to FIGS. 7 and 8, in which the shield region 6 is omitted from the structure of the pixel $Q_{ij}$ of the photogate image sensor illustrated in FIGS. 1 to 3B, while the photogate voltage VPG is kept constant. The axis of abscissas in FIG. 7 is an output level of pixels during dark time in the comparative example, and the axis of ordinates is cumulative frequency of occurrence of a dark current. The value of the reset-drain voltage VRD is set at approximately 2 volts.

While the fixed photogate voltage VPG applied constantly is used as a parameter, the photogate voltage VPG is varied from zero volt to −2 volts.

In the photogate image sensor according to the comparative example, as illustrated in FIG. 7, as the photogate voltage VPG applied constantly is shifted to a value in the negative direction, the dark current is greatly increased. The reason for this is probably the trap-assisted tunneling (TAT) or the band-to-band tunneling (BTBT) caused at the boundary between the charge-readout region 8, which is the charge-detection portion $FD_{(i, j)}$, and the photogate $PG_{(i, j)}$. The TAT or the BTBT generates excessive electrons, as the electric field concentration is generated between the charge-detection portion $FD_{(i,j)}$ and the photogate $PG_{(i,j)}$, as illustrated in FIG. 8, in association with the shift of the photogate voltage VPG increased in the negative direction, while the voltage of the charge-detection portion $FD_{(i, j)}$ is kept at a high positive value.

It is necessary to decrease the voltage of the charge-detection portion $FD_{(i,j)}$, namely, the reset-drain voltage VRD to a value as low as 1 volt, for example, in order to prevent the electric field concentration. However, possible signal amplitude in the charge-detection portion $FD_{(i,j)}$ is reduced in the photogate image sensor according to the comparative example. That is, in the photogate image sensor according to the comparative example, because the photogate voltage VPG is kept constant, the charge-detection margin is greatly reduced, and accordingly, the dynamic range is decreased.

In contrast, the photogate image sensor according to the first embodiment can suppress a generation of a dark current because the voltage applied to the transparent electrode 14 is not a negative voltage, and even when the voltage is approximate to zero volt, the surface potential of the shield region 6 can be pinned by charges (holes) of majority carriers due to the electrostatic potentials induced by the transparent electrode 14 on the shield region 6 via the gate insulating-film 4. Further, since the electric field concentration between the charge-detection portion $FD_{(i,j)}$ and the photogate $PG_{(i,j)}$ can be suppressed without a decrease in the voltage of the charge-detection portion $FD_{(i,j)}$, namely, the reset-drain voltage VRD, the charge-detection margin can be ensured. Accordingly, the radiation-hardened image sensor with high sensitivity and wide dynamic range can be achieved.

Second Embodiment

A photogate image sensor according to a second embodiment is illustrated with a case in which the photogate voltage VPG applied to the photogate $PG_{(i, j)}$ is not a constant value but is subjected to a clocking operation between two values. The photogate image sensor according to the second embodiment differs from the photogate image sensor according to the first embodiment illustrated in FIG. 1 in the circuit structure further including a photogate scanner 21 for binary drive. The photogate scanner 21 for binary drive is provided at the periphery of the pixel area, in which a plurality of photogate-pixels $Q_{ij}$ is arranged in a matrix form, as illustrated in FIG. 9.

Figure 11:
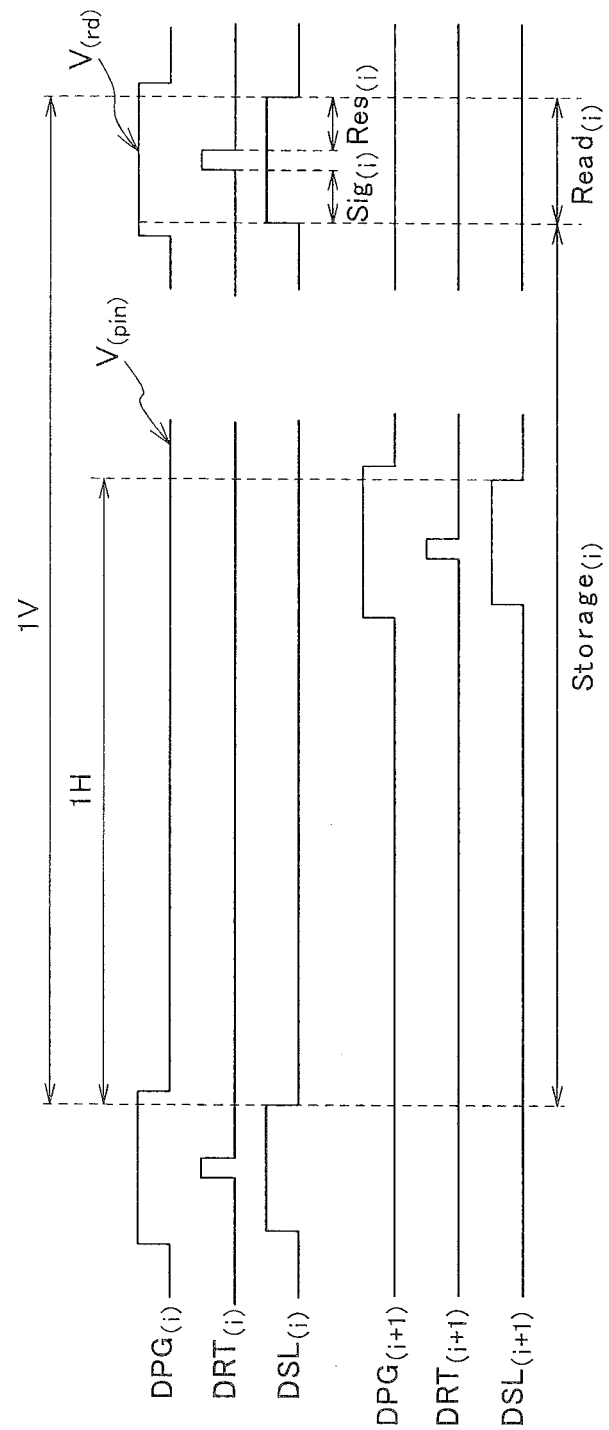
FIG. 11 is a chart for describing a drive timing of the photogate image sensor according to the second embodiment.

The photogate scanner 21 applies, to the transparent electrode 14 of the respective pixels $Q_{ij}$ illustrated in FIGS. 2, 3A, and 3B, a first voltage at which the surface potential at the interface between the shield region 6 and the gate insulating-film 4 is pinned by majority carriers in the shield region 6 and a second voltage shifted from the first voltage in a direction in which the channel potential of the buried charge-generation region 5 deepens. And then, the photogate scanner 21 executes a clocking operation between the first and second voltages. In particular, according to the timing chart as illustrated in FIG. 11, the photogate scanner 21 divides one frame into a "storage period" and a "readout period" at each row (i), and applies, to the transparent electrode 14 of the respective pixels $Q_{ij}$, the first voltage in the storage period and the second voltage in the readout period so as to implement the clocking operation.

Figure 9:
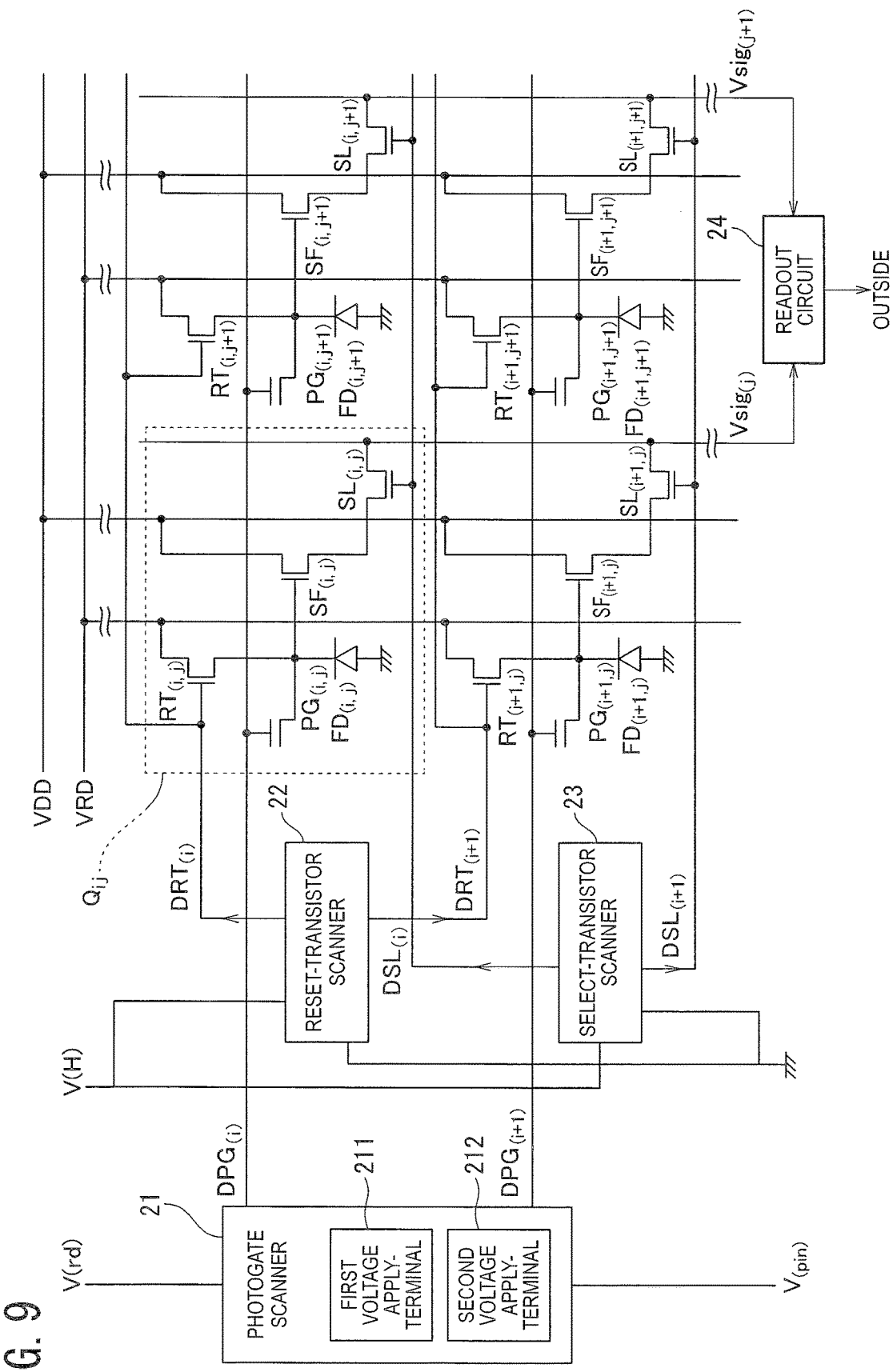
FIG. 9 is a circuit diagram illustrating a schematic structure of an entire photogate image sensor according to a second embodiment of the present invention.

As illustrated in FIG. 9, the m-number of photogate drive-lines corresponding to the m-number of rows in the matrix are distributed from the photogate scanner 21. For example, photogate drive-lines $DPG_{(i)}$ and $DPG_{(i+1)}$ are connected to the gates of the photogates $PG_{(i,j)}$ and $PG_{(i+1,j)}$ in the pixels $Q_{ij}$ and $Q_{i+1,j}$ belonging in the i-th and (i+1)-th rows, respectively. The photogate scanner 21 controls, in units of rows, voltages applied to the photogates $PG_{(i, j)}$ and $PG_{(i+1, j)}$ in the pixels $Q_{ij}$ and $Q_{i+1, j}$ belonging in the i-th and (i+j)-th rows in the matrix via the photogate drive-lines $DPG_{(i)}$ and $DPG_{(i+1)}$. Although not illustrated in FIG. 9, voltages applied to photogates belonging in other rows, such as (i−1)-th and (i+2)-th rows in the matrix, are also controlled in units of rows.

The photogate scanner 21 includes a first voltage apply-terminal 211 and a second voltage apply-terminal 212. The first voltage apply-terminal 211 is a node for applying the first voltage $V_{(pin)}$ in the storage period to accumulate charges generated in the photogate $PG_{(i, j)}$ due to a photoelectric conversion and storage effect. When the first voltage $V_{(pin)}$ is applied, the pinning is carried out so that charges with reverse polarity reverse to charges of an output signal are accumulated in the shield region 6 immediately below the photogate $PG_{(i, j)}$. The first voltage $V_{(pin)}$ is applied to the photogate $PG_{(i,j)}$ so that the photogate channel potential for the charges of the output signal is shallow.

The second voltage apply-terminal 212 is a node for applying the second voltage $V_{(rd)}$ in the readout period to detect, as a signal, signal charges photo-electrically converted in the storage period by the photogate $PG_{(i,j)}$. The second voltage $V_{(rd)}$ is applied to the photogate $PG_{(i, j)}$ so that the photogate channel potential for the signal charges of the output signal is deepened. During the application of the second voltage $V_{(rd)}$ in the readout period, the charge-readout region 8 implementing the charge-detection portion $FD_{(i, j)}$ is reset to the reset-drain voltage VRD. Since the signal charges are accumulated before the reset operation, and the signal charges are exhausted after the reset operation, a net signal component due to the photo-electric conversion is read out from a potential difference between the potentials before and after the reset operation at the charge-readout region 8.

As described below, because the potential of the charge-readout region 8 implementing the charge-detection portion $FD_{(i,j)}$ can be increased so as to ensure the charge-detection margin, and the voltage of the transparent electrode 14 in the photogate $PG_{(i,j)}$ can also be increased to the second voltage $V_{(rd)}$, the potential difference between the charge-readout region 8 implementing the charge-detection portion $FD_{(i, j)}$ and the transparent electrode 14 in the photogate $PG_{(i, j)}$ will be kept at a low value in the readout period.

When the first voltage $V_{(pin)}$, is applied to the photogate $PG_{(i,j)}$ in the storage period, because the charge-readout region 8 implementing the charge-detection portion $FD_{(i,j)}$ is in a floating state, in association with the decrease of the photogate voltage VPG from the second voltage $V_{(rd)}$ to the first voltage $V_{(pin)}$, the potential of the charge-readout region 8 is also decreased due to capacitive coupling between the transparent electrode 14 in the photogate $PG_{(i,\ j)}$ and the charge-readout region 8 implementing the charge-detection portion $FD_{(i,\ j)}$. Accordingly, the potential difference between the charge-readout region 8 implementing the charge-detection portion $FD_{(i,j)}$ and the transparent electrode 14 in the photogate $PG_{(i,j)}$ can be kept at a low value also in the storage period.

The first voltage $V_{pin}$ is set at a lower voltage than the second voltage $V_{(rd)}$. The first voltage $V_{(pin)}$ and the second voltage $V_{(rd)}$ are determined in view of a reset level of the reset-drain voltage VRD applied to the reset-drain region 7. In the photogate image sensor according to the second embodiment, as a result of a simulation of the potential of the buried charge-generation region 5 for the signal charges by a one-dimensional calculation, it has been found out that the reset level can be set at approximately 2 to 3 volts, and the second voltage $V_{(rd)}$ applied to the photogate $PG_{(i,j)}$ can be set at approximately 0 to 1 volt. Since the voltage $V_{FD(ij)}$ of the charge-detection portion $FD_{(i,\ j)}$ is a value decreased from the reset level by a reset feedthrough (typically, a positive value of 0.5 volt or less), the following condition is fulfilled in the readout period:

$$V_{FD(ij)} - VPG \geq 2 \text{ to 3 volts} \quad (1)$$

The potential relationship ascribable to the relation prescribed by Eq. (1) will be described below.

In the storage period, the first voltage $V_{(pin)}$, applied to the photogate $PG_{(i,j)}$ can be set at approximately zero volt according to the one-dimensional calculation described above as a value capable of the pinning operation. The potential difference between the voltage $V_{FD(ij)}$ of the charge-detection portion $FD_{(i,j)}$ and the photogate voltage VPG is further decreased, since the value in the readout period is kept at the beginning of the storage period, and the potential $V_{FD(ij)}$ of the charge-detection portion $FD_{(i,\ j)}$ is decreased in association with the subsequent accumulation of the signal charges. The second voltage $V_{(rd)}$ and the first voltage $V_{(pin)}$ may be other values at which the charge-detection margin can be ensured during the readout operation, and the pinning operation can be implemented during the storage operation, other than the values as described above. Both of the first voltage $V_{(pin)}$ and the second voltage $V_{(rd)}$ transmitted from the photogate scanner 21 can be generated by a scheme with a gradual shift, which is accomplished using conventionally-known level shifters.

In the photogate image sensor according to the second embodiment illustrated in FIG. 9, the drive signals for controlling the photogate voltage VPG are delivered to the photogate drive-lines $DPG_{(i)}$ and $DPG_{(i+1)}$ in units of rows so as to change the voltage applied to the photogate $PG_{(i,\ j)}$ per readout row. The respective photogate drive-lines $DPG_{(i)}$ and $DPG_{(i+1)}$ are selected by a vertical scanning circuit, and the all photogates $PG_{(i,j)}$ are driven so as to be shifted to a higher-level voltage in the readout period and shifted to a lower voltage in the storage period than the voltage in the readout period.

FIG. 11 is a timing diagram illustrating a drive timing focusing on the photogate drive-lines $DPG_{(i)}$ and $DPG_{(i+1)}$, the reset drive-lines $DRT_{(i)}$ and $DRT_{(i+1)}$, and the selection drive-lines $DSL_{(i)}$ and $DSL_{(i+1)}$ in the i-th and (i+1)-th rows, among the drive-lines extending in the horizontal direction in FIG. 9. The symbol "1H" represents a row-readout period, and the symbol "1V" represents a frame-readout period, on the assumption that the readout operation is carried out in order of row by row.

First, in the pixel $Q_{ij}$ in the i-th row, the photo-electric conversion and storage operation in which the photogate $PG_{(i,j)}$ is set at the first voltage $V_{(pin)}$ is carried out in the storage period Storage(i). The selection drive-line $DSL_{(i)}$ of the select-transistor scanner 23 is then shifted to a higher-level voltage in the readout period Read(i), so that the pixel signal is read out to the output line in the readout period Read(i) in the pixel $Q_{ij}$ in the i-th row. The photogate drive-line $DPG_{(i)}$ of the photogate scanner 21 is shifted to the second voltage $V_{(rd)}$ slightly before the readout operation, and the reset drive-line $DRT_{(i)}$ of the reset-transistor scanner 22 is shifted to a higher-level voltage at the intermediate stage of the readout period, so that the charge-readout region 8 is reset.

Immediately before the reset operation, a signal $Sig_{(i)}$ of the signal charges having been accumulated in the charge-detection portion $FD_{(i,\ j)}$ is read out from the charge-readout region 8. Immediately after the reset operation, a signal $Res_{(i)}$ at the reset level in which the signal charges of the charge-detection portion $FD_{(i,\ j)}$ are exhausted is read out from the charge-readout region 8. The signals are then subjected to correlated double sampling (CDS) in the readout circuit 24 which reads a difference between the signal $Sig_{(i)}$ of the signal charges accumulated and the signal $Res_{(i)}$ at the reset level, so as to obtain net signals. Although the surface potential of the shield region 6 cannot be pinned during the readout period Read(i), the readout period Read(i) is significantly shorter than the frame period (1V), so that an influence of a dark current generated during the readout period Read(i) can be ignored as described above.

The readout period is transferred to the storage period after the readout operation, and the photogate drive-line $DPG_{(i)}$ of the photogate scanner 21 is changed to the first voltage $V_{(pin)}$ at which the potential of the photogate $PG_{(i,\ j)}$ is pinned. The charge-readout region 8 of the charge-detection portion $FD_{(i,j)}$ is in the floating state during the period other than the interval in which the reset drive-line $DRT_{(i)}$ of the reset-transistor scanner 22 is at the higher-level voltage in the readout period. Therefore, when the photogate drive-line $DPG_{(i)}$ of the photogate scanner 21 is changed from the second voltage $V_{(rd)}$ at the higher-level voltage in the readout period to the first voltage $V_{(pin)}$ at the lower-level voltage in the storage period, the voltage level of the charge-readout region 8 is also shifted to the lower-level voltage. Accordingly, the potential difference between the charge-detection portion $FD_{(i,j)}$ and the charge-readout region 8 remains a small value, so as to prevent electric field concentration and suppress a generation of a dark current. The timing at which the photogate drive-line $DPG_{(i)}$ is shifted between the first voltage $V_{(pin)}$ and the second voltage $V_{(rd)}$ is preferably in a period in which the selection drive-line $DSL_{(i)}$ is in an off state (at the lower-level voltage), as illustrated in FIG. 11, in order to prevent such a shift from having an influence on the signal-line.

Thereafter, the same operation as in the i-th row is repeated sequentially in the (i+1)th row, the (i+2)th row, the (i+3)th row, . . . per horizontal scanning period in the time direction, so as to carry out the readout operation for the entire pixel area in the photogate image sensor. The potential difference between the charge-readout region 8 and photogate $PG_{(i,j)}$ is kept at a small value in each row so as to prevent electric field concentration.

Figure 10A:
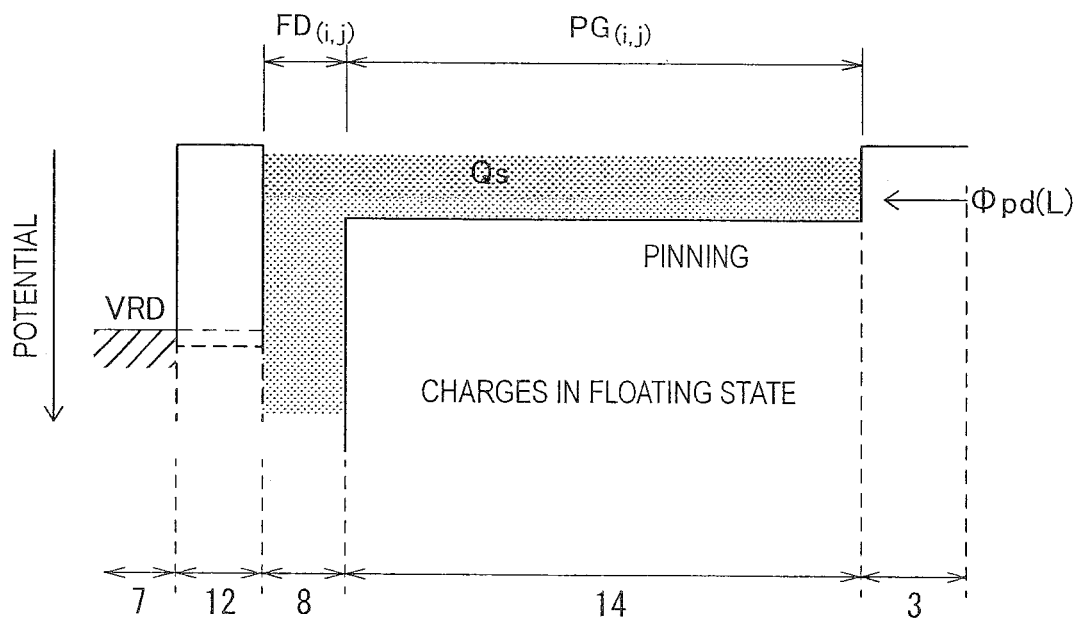
FIG. 10A is a diagram for describing a potential profile during charge storage in an optical-detection element according to the second embodiment.

A change in the potential state of the respective pixels $Q_{ij}$ in each of the readout period during the reset operation and the signal detection operation and the storage period during the photo-electric conversion and storage operation is described below with reference to FIGS. 10A and 10B. As illustrated in FIG. 101B, the second voltage $V_{(rd)}$ of the transparent electrode 14 of the photogate $PG_{(i,j)}$ is relatively high and the potential is deep during the readout period in which the signal is detected and read out. When the reset-transistor $RT_{(i,\ j)}$ is turned on, the potentials of the charge-detection portion $FD_{(i,j)}$ and the buried charge-generation region 5 below the photogate $PG_{(i,j)}$ are reset to a deep potential level $\Phi pd$ (H) corresponding to the high potential.

When the second voltage $V_{(rd)}$ of the transparent electrode 14 of the photogate $PG_{(i,\ j)}$ and the reset-drain voltage VRD of the reset-transistor $RT_{(i,\ j)}$ are set to appropriate values with appropriate timing, the charges are accumulated also in the buried charge-generation region 5 below the photogate $PG_{(i,\ j)}$. The reset-transistor $RT_{(i,j)}$ is then turned off, so that the charges of the charge-detection portion $FD_{(i,j)}$ and the buried charge-generation region 5 below the photogate $PG_{(i,\ j)}$ are changed to a floating state. Although the following is the case in which the charges are also accumulated in a channel below the photogate $PG_{(i,\ j)}$, the present invention can be applicable to a case in which the charges are accumulated only in the charge-detection portion $FD_{(i,\ j)}$.

The pixel $Q_{ij}$ is then changed to the photo-electric conversion and storage operation in the storage period. The photogate voltage VPG applied to the transparent electrode 14 of the photogate $PG_{(i,j)}$ is shifted to the first voltage $V_{(pin)}$ until the shield region 6 is pinned to be covered with holes. As illustrated in FIG. 10$i$A, in the storage period in which the signal charges are accumulated, since the charges accumulated in the charge-detection portion $FD_{(i,j)}$ and the buried charge-generation region 5 below the photogate $PG_{(i,j)}$ are in the floating state, the potential of the buried charge-generation region 5 is shifted to a relatively shallow level $\Phi pd$ (L) in association with the potential change in the gate voltage of the photogate $PG_{(i,\ j)}$ due to the capacitive coupling between the photogate $PG_{(i,\ j)}$ and the buried charge-generation region 5 and the charge-detection portion $FD_{(i,\ j)}$. Although not illustrated in FIG. 10A, when the charges are accumulated only in the charge-detection portion $FD_{(i,j)}$, the potential of the charge-detection portion $FD_{(i,j)}$ can be shifted to a lower potential due to the capacitive coupling between the photogate $PG_{(i,j)}$ and the charge-detection portion $FD_{(i,j)}$.

Since the potential difference between the charge-detection portion $FD_{(i,j)}$ and the photogate $PG_{(i,j)}$ can remain small, a dark current caused on the surface of the shield region 6 in the photogate $PG_{(i,\ j)}$ is suppressed, the dark current is ascribable to the pinning state. And simultaneously, a dark current due to electric field concentration is also suppressed during the photo-electric conversion and storage operation. Then, as the potential returns to the state illustrated in FIG. 10B, the signal is read out at the beginning of the subsequent readout period and immediately before the reset operation and the net signal amount is obtained from the shift amount of the potential, which is changed from the reset level $\Phi pd$ (H) due to the signal charges. The rest level $\Phi pd$ (H) is obtained after the reset operation.

Figure 10B:
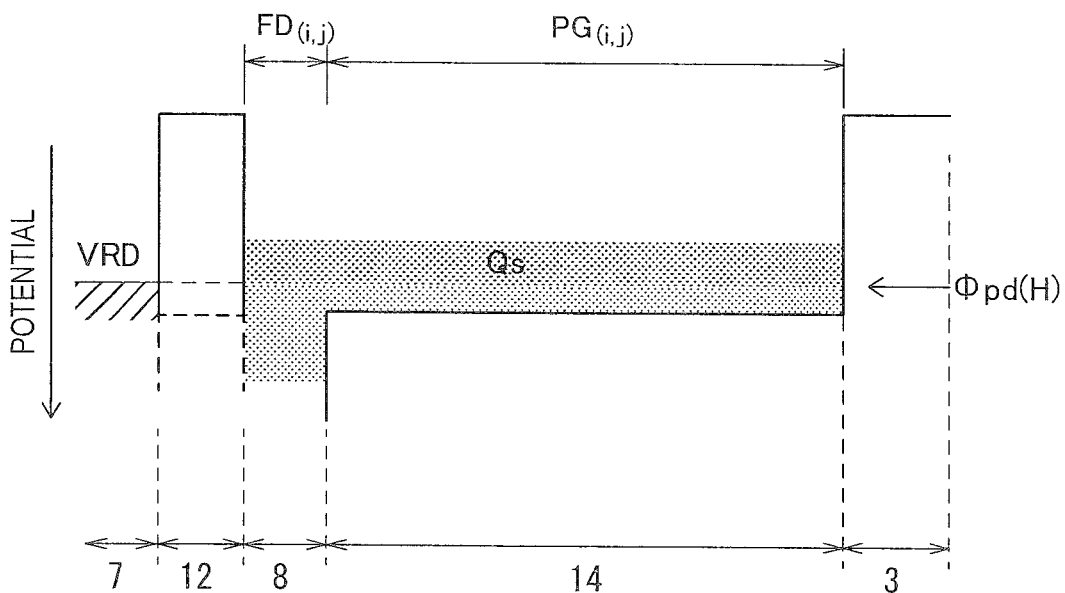
FIG. 10B is a diagram for describing a potential profile during reset and signal detection in the optical-detection element according to the second embodiment.

When the photogate voltage VPG is reset to the second voltage $V_{(rd)}$ as illustrated in FIG. 10B, the charges can be accumulated in the channel of the photogate $PG_{(i,\ j)}$. Although the surface potential of the shield region 6 cannot be pinned when the photogate voltage VPG is the second voltage $V_{(rd)}$, the readout period in which the photogate voltage VPG is at the second voltage $V_{(rd)}$ is significantly shorter than the frame period, so that an influence of a dark current generated during the readout period can be ignored. The signal charges (electrons) photo-electrically converted in the photogate $PG_{(i,\ j)}$ are accumulated in the charge-readout region 8 and the photogate $PG_{(i,\ j)}$. Therefore, while the charge-voltage conversion gain is low and the voltage sensitivity is low because of a large capacitance of the detection portion, the amount of the charges to be accumulated can be increased.

The potential of the charge-readout region 8 after the reset operation in the readout period is finished is in the floating state. When the photogate voltage VPG is shifted to a lower-level voltage capable of the pinning operation after the readout period, as illustrated in FIG. 10A, the potential of the charge-readout region 8 is also shifted to a low potential. That is, the pinning operation is carried out in the photogate $PG_{(i,j)}$ during the photo-electric conversion and storage operation after the readout period, and the potential difference between the photogate $PG_{(i,j)}$ and the charge-detection portion $FD_{(i,\ j)}$ results in a small value. Accordingly, a dark current generated during the photo-electric conversion and storage operation can greatly be reduced.

As described above, the photogate image sensor according to the second embodiment can prevent electric field concentration in the charge-detection portion $FD_{(i,\ j)}$ to suppress a generation of a dark current while the charge-detection margin is ensured in the storage period even when the first voltage $V_{(pin)}$ approximate to zero volt is applied to the gate of the photogate $PG_{(i,j)}$ for pinning the potential, as in the case of the photogate image sensor according to the first embodiment.

Further, the pixel $Q_{ij}$ according to the second embodiment uses the photogate scanner 21 to vary the photogate voltage VPG and divide one frame into the two periods at each row (i), so that the photogate voltage VPG is set at the second voltage $V_{(rd)}$ at a higher-level voltage during the readout period. Further, the voltage at the reset level is set at a higher-level voltage to reset the charge-readout region 8, so as to shift the charge-readout region 8 to a high potential. Accordingly, the charge-detection margin can be ensured, the potential difference between the photogate $PG_{(i,j)}$ and the charge-detection portion $FD_{(i,j)}$ can be decreased, electric field concentration during the readout period can be prevented, and an excessive dark current generated during the readout period can be suppressed.

The scheme of the second embodiment, in which the photogate voltage VPG is subjected to the clocking operation between the two voltage values, is also applicable to a case excluding the shield region 6 from the pixel $Q_{ij}$, the schemes of omitting the shield region 6 will be described in fifth and seventh embodiments below. The reason why the shield region 6 can be omitted from the pixel $Q_{ij}$ is that the potential difference between the charge-readout region 8 and the photogate $PG_{(i,j)}$ can be decreased since the photogate $PG_{(i,j)}$ is at a higher-level voltage during the charge readout for higher-level voltage of the charge-readout region 8, and the potential of the charge-readout region 8 in the floating state can also be decreased even when the photogate voltage VPG is decreased to a lower level during the charge storage, and therefore the potential difference between the charge-readout region 8 and the photogate $PG_{(i,\ j)}$ is kept at a small value.

Third Embodiment

Figure 12:
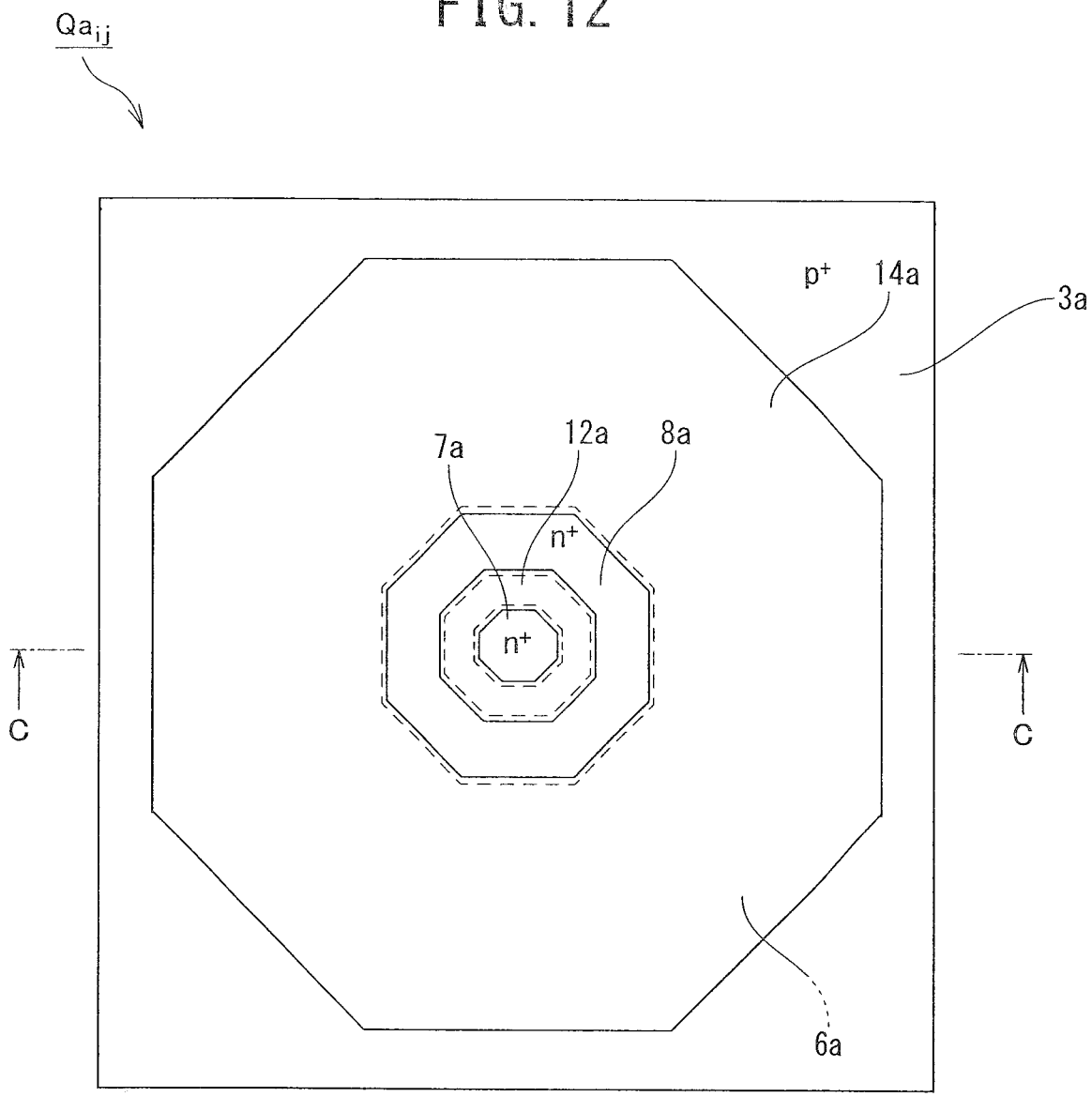
FIG. 12 is a schematic plan view illustrating an optical-detection element of one pixel included in a photogate image sensor according to a third embodiment of the present invention.
Figure 13:
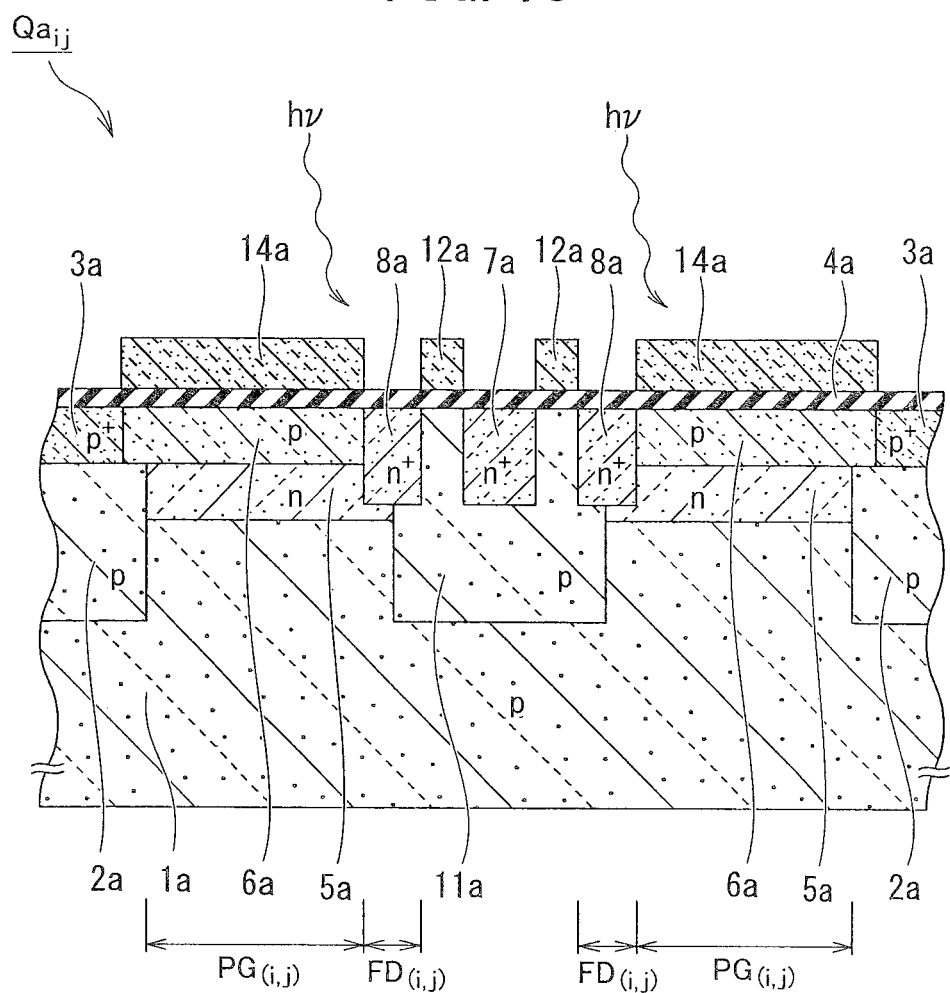
FIG. 13 is a cross-sectional view of the optical-detection element taken from the direction C-C in FIG. 12.

A photogate-pixel $Qa_{ji}$ according to a third embodiment differs from the pixel $Q_{ij}$ pertaining to the first embodiment in that the photogate $PG_{(i,\ j)}$ and the charge-detection portion $FD_{(i,\ j)}$ are each delineated into an annular form in a planar pattern, as illustrated in FIG. 12. As illustrated in FIGS. 12 and 13, a reset-drain region 7a, a reset-gate electrode 12a, a charge-readout region 8a, a buried charge-generation region 5a, a shield region 6a, and a transparent electrode 14a above the buried charge-generation region 5a and the shield region 6a are concentrically arranged sequentially from the center toward the outside.

The pixel $Qa_{ij}$ according to the third embodiment includes the transparent electrode 14a implementing the photogate $PG_{(i, j)}$, the charge-readout region 8a implementing the charge-detection portion $FD_{(i, j)}$ arranged adjacent to the photogate $PG_{(i, j)}$, and the reset-gate electrode 12a and the reset-drain region 7a serving as a reset-transistor for resetting a potential of the charge-readout region 8a. Although not illustrated in FIG. 12 or FIG. 13, the pixel $Qa_{ij}$ according to the third embodiment includes an amplification-transistor for amplifying a potential change of the charge-readout region 8a, and a select-transistor for selecting an output of the amplification-transistor.

As illustrated in FIG. 13, the pixel $Qa_{ij}$ according to the third embodiment includes a p-type supporting-layer 1a, and a gate insulating-film 4a contacted with an upper surface of the supporting-layer 1a. The n-type buried charge-generation region 5a is buried in a part of an upper portion of the base-body portion 1a. The shield region 6a is buried in an upper portion of the buried charge-generation region 5a and in contact with the gate insulating-film 4a. The transparent electrode 14a delineated into an annular form in a planar pattern is stacked on the gate insulating-film 4a and allocated above the buried charge-generation region 5a and the shield region 6a.

As illustrated in FIG. 12, the pixel $Qa_{ij}$ according to the third embodiment has a rectangular shape in a planar pattern, and the annular photogate $PG_{(i,j)}$ is arranged in the rectangular pixel $Qa_{ij}$. FIG. 12 illustrates the upper surface of the pixel $Qa_{ij}$, while the illustration of the gate insulating-film 4a is omitted. As illustrated in FIG. 13, a p-type buried pixel-isolation region 2a is buried in the upper portion on the peripheral side of the supporting-layer 1a in the pixel $Qa_{ij}$, and a p$^+$-type joint-region 3a having a higher impurity concentration than the buried pixel-isolation region 2a is buried in a part of an upper portion of the buried pixel-isolation region 2a and in contact with the gate insulating-film 4a to serve as a channel-stop region. Since the respective pixels $Qa_{ij}$ are isolated from each other by the p-type buried pixel-isolation regions 2a and the p$^+$-type joint-regions 3a, a pixel-isolation oxide film (not illustrated), which tends to be deteriorated by irradiation of gamma rays, can be isolated from the buried charge-generation region 5a.

A p-type well region 11a having the same impurity concentration as the buried pixel-isolation region 2a is buried in the upper portion at a central area of the supporting-layer 1a in the pixel $Qa_{ij}$ at the same depth as the buried pixel-isolation region 2a. The n$^+$-type reset-drain region 7a having a higher impurity concentration than the buried charge-generation region 5a is buried in a part of an upper portion at the central area of the well-region 11a and in contact with the gate insulating-film 4a. The n$^+$-type charge-readout region 8a having a higher impurity concentration than the buried charge-generation region 5a is buried in the region across a part of the upper portion of the well region 11a and a part of the upper portion of the buried charge-generation region 5a and in contact with the gate insulating-film 4a. The p-type well region 11a and the p-type buried pixel-isolation region 2a may be buried as a common region by the same process, so as to simplify the manufacturing process. The p-type buried pixel-isolation region 2a and the p-type well region 11a are not necessarily buried at the same depth or do not necessarily have the same impurity concentration if the simplification of the manufacturing process is not taken into account.

The reset-gate electrode 12a delineated into an annular form in a planar pattern is stacked on the gate insulating-film 4a and allocated above the well region 11a between the reset-drain region 7a and the charge-readout region 8a. The structures of the layers or regions in the photogate image sensor according to the third embodiment are identical to the structures of the layers or regions denoted by the same reference numerals in the photogate image sensor pertaining to the first embodiment, and overlapping explanations thereof are thus not repeated below.

The pixel $Qa_{ij}$ according to the third embodiment can be substituted for the pixel $Q_{ij}$ pertaining to the first embodiment illustrated in FIG. 1, and the operations of the photogate image sensor according to the third embodiment are similar to the operations of the photogate image sensor pertaining to the first embodiment as described with reference to FIG. 6. Alternatively, the pixel $Qa_{ij}$ according to the third embodiment can be substituted for the pixel $Q_{ij}$ pertaining to the second embodiment illustrated in FIG. 9, and the operations of the photogate image sensor according to the third embodiment are similar to the operations of the photogate image sensor pertaining to the second embodiment as described with reference to FIG. 11.

The photogate image sensor according to the third embodiment applies the voltage approximate to zero volt to the gate of the photogate $PG_{(i,j)}$ so that the potential is pinned while the charge-detection margin is ensured, so as to prevent electric field concentration in the charge-detection portion $FD_{(i, j)}$ to suppress a generation of a dark current, as in the case of the photogate image sensors of the first and second embodiments.

Fourth Embodiment

Figure 14:
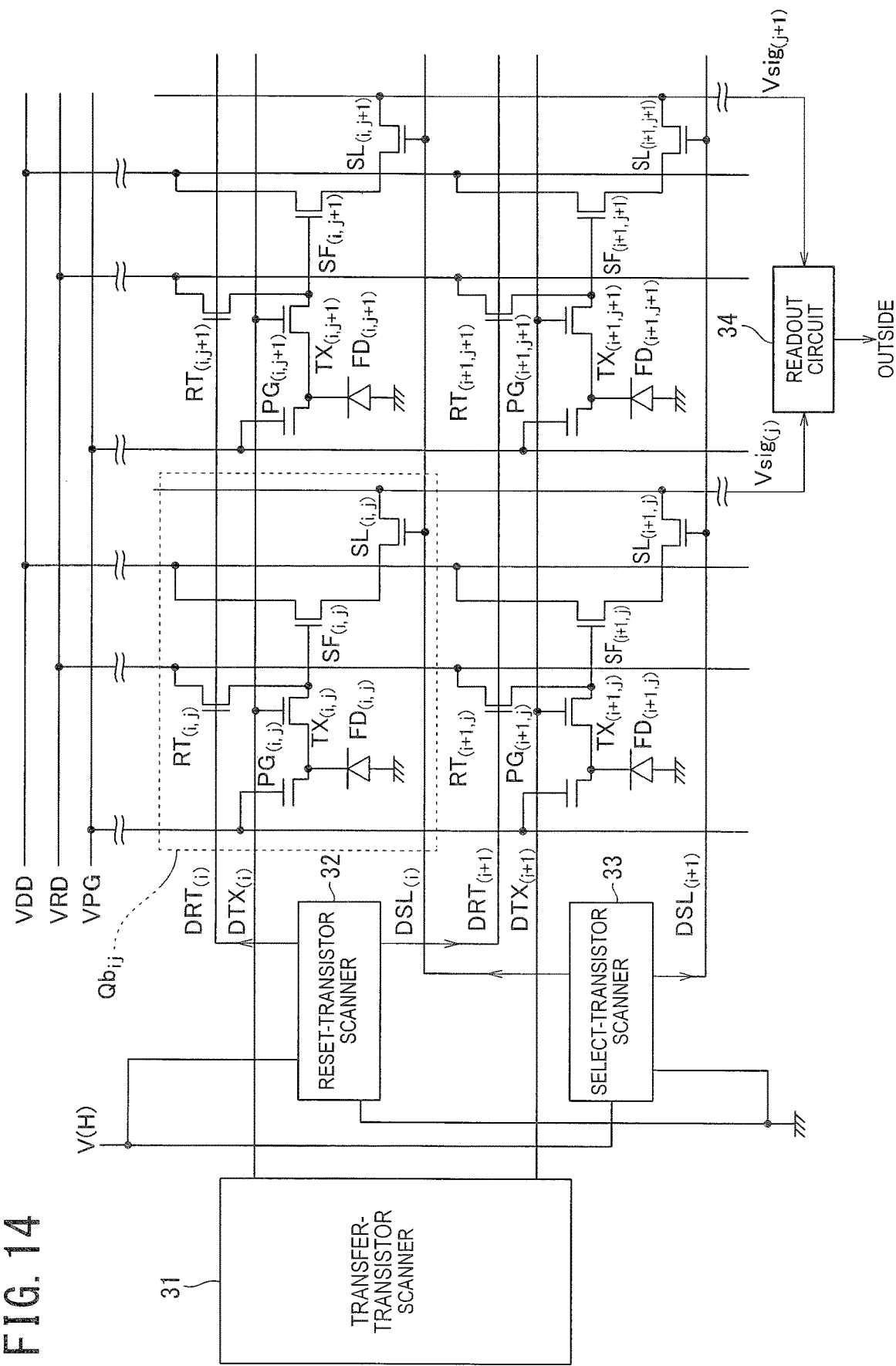
FIG. 14 a circuit diagram illustrating a schematic structure of an entire photogate image sensor according to a fourth embodiment of the present invention.

As illustrated in FIG. 14, a photogate image sensor according to a fourth embodiment of the present invention includes a pixel area in which a plurality of photogate-pixels $Qb_{ij}$ each including a charge-transfer mechanism is arranged in a matrix form, and a peripheral circuit including a transfer-transistor scanner 31, a reset-transistor scanner 32, a select-transistor scanner 33, a readout circuit 34, and the like disposed at the periphery of the pixel area.

Figure 15:
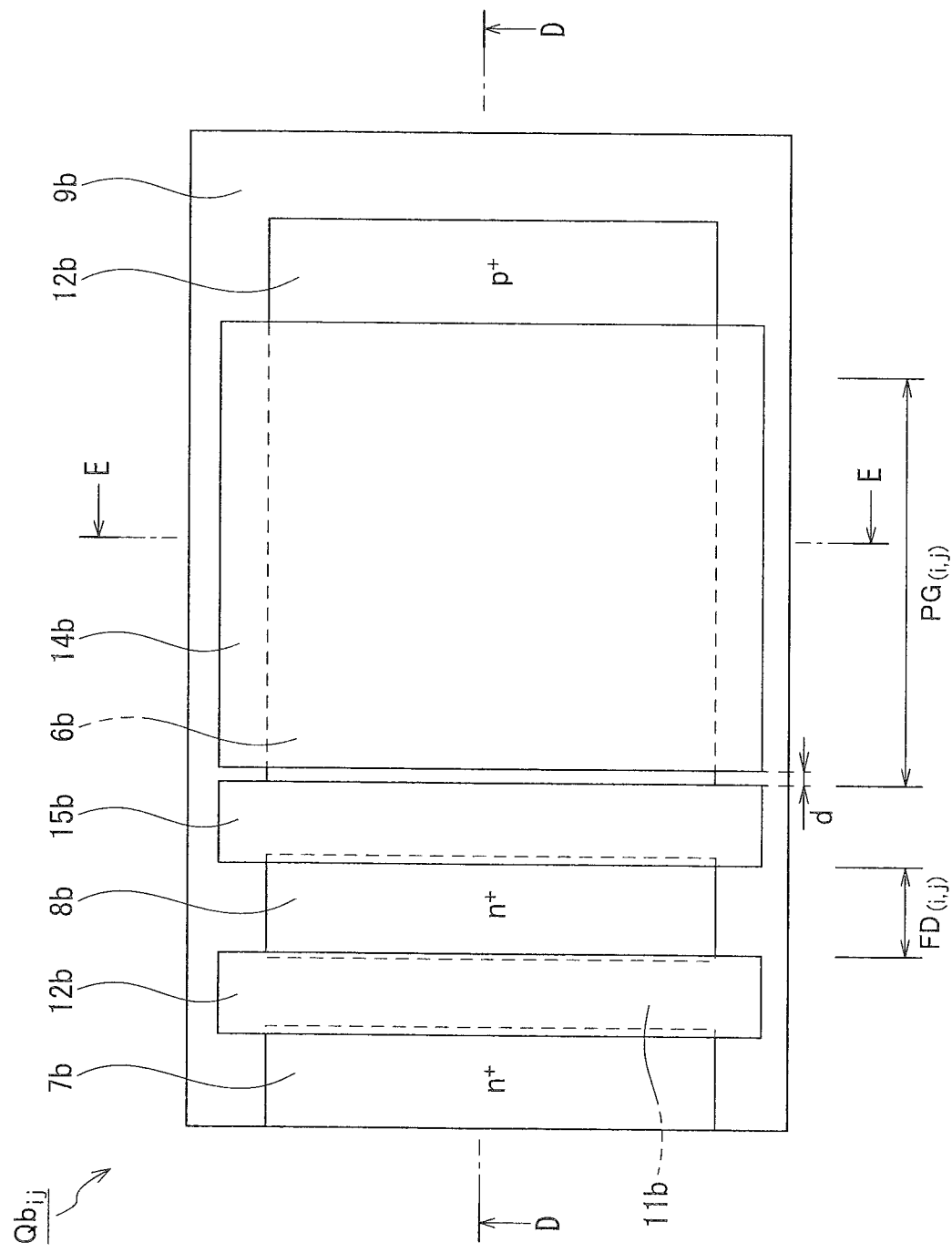
FIG. 15 is a schematic plan view illustrating an optical-detection element of one pixel included in the photogate image sensor according to the fourth embodiment.
Figure 16A:
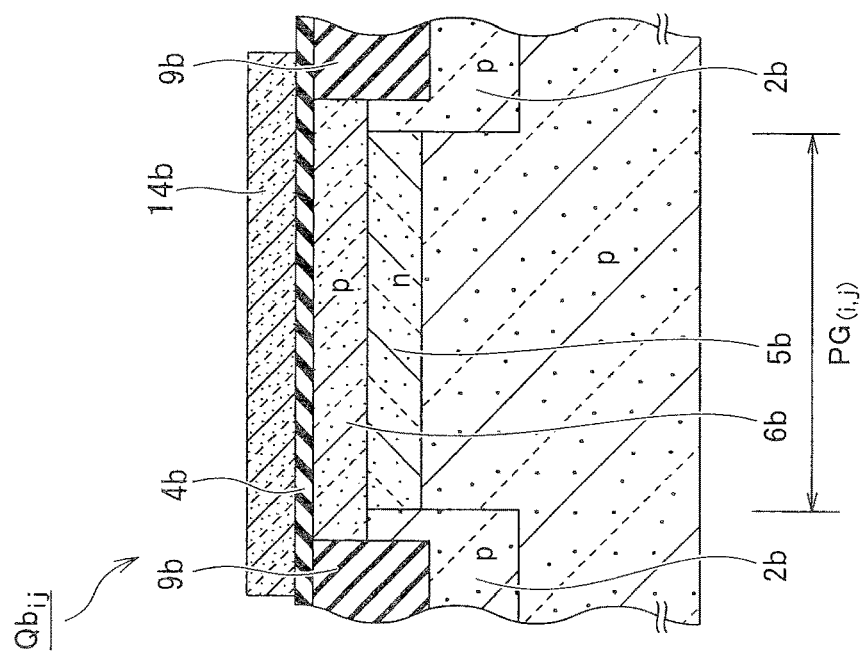
FIG. 16A is a cross-sectional view of the optical-detection element taken from the direction D-D in FIG. 15.
Figure 16B:
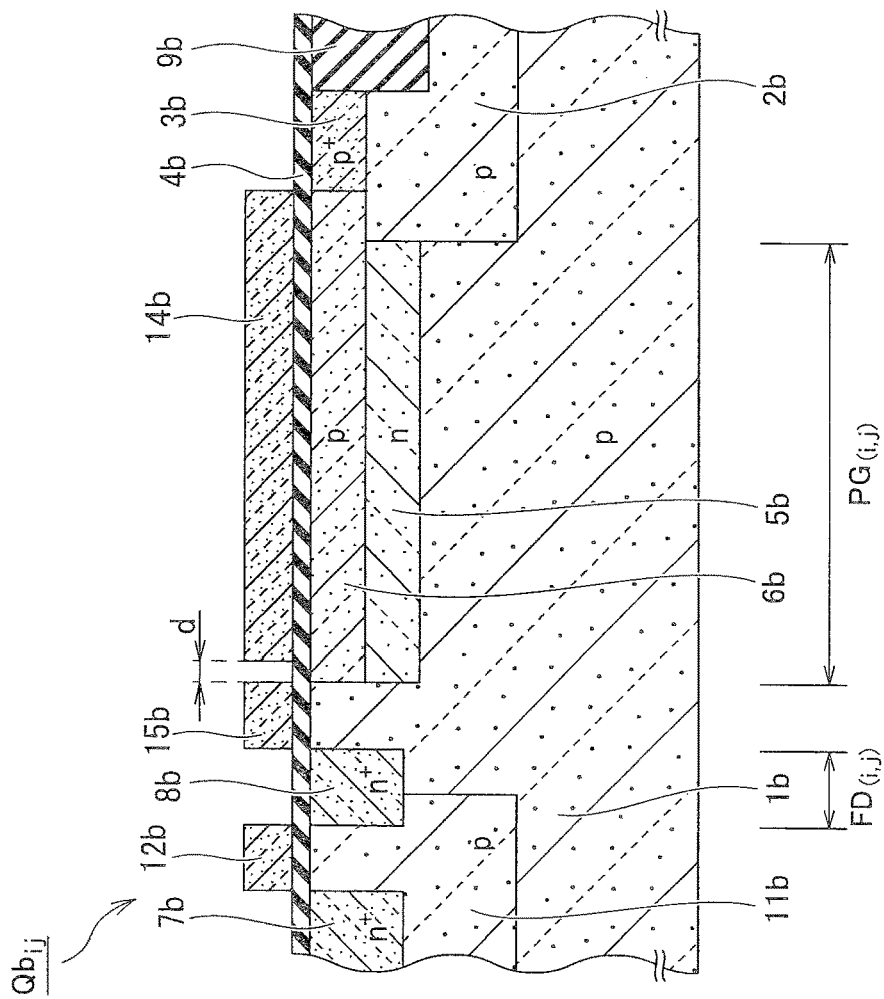
FIG. 16B is a cross-sectional view of the optical-detection element taken from the direction E-E in FIG. 15.

As illustrated in FIGS. 15, 16A, and 16B, the pixel $Qb_{ij}$ according to the fourth embodiment is similar to the pixel $Q_{ij}$ pertaining to the first embodiment in the photogate structure including a p-type supporting-layer 1b, an n-type buried charge-generation region 5b buried in an upper portion of the supporting-layer 1b to implement a photodiode with the supporting-layer 1b, a p-type shield region 6b buried at an upper surface of the buried charge-generation region 5b, a gate insulating-film 4b contacted with an upper surface of the shield region 6b, and a transparent electrode 14b provided on the gate insulating-film 4b. Similar to the structure of the pixel $Q_{ij}$ pertaining to the first embodiment, the pixel $Qb_{ij}$ of the fourth embodiment further includes an n-type charge-readout region 8b having a higher impurity concentration than the buried charge-generation region 5b and buried in the upper portion of the base-body portion 1b, an n-type reset-drain region 7b having a higher impurity concentration than the buried charge-generation region 5b and buried separately from the charge-readout region 8b, and a reset-gate electrode 12b stacked on the gate insulating-film 4b and allocated above the supporting-layer 1b between the charge-readout region 8b and the reset-drain region 7b.

However, the pixel $Qb_{ij}$ according to the fourth embodiment differs from the pixel $Q_{ij}$ pertaining to the first embodiment, in a feature such that the pixel $Qb_{ij}$ of the fourth embodiment further includes a transfer-gate electrode 15b allocated above the supporting-layer 1b and the gate insulating-film 4b between the transparent electrode 14b and the charge-readout region 8b and adjacent to the transparent electrode 14b with a gap d provided between the transfer-gate electrode 15b and the transparent electrode 14b. As described below, when a voltage applied to the transfer-gate electrode 15b is shifted from a lower-level voltage to a higher-level voltage, signal charges are transferred from the buried charge-generation region 5b to the charge-readout region 8b. The gap d between the transfer-gate electrode 15b and the transparent electrode 14b may be designed as small as possible.

Figure 17:
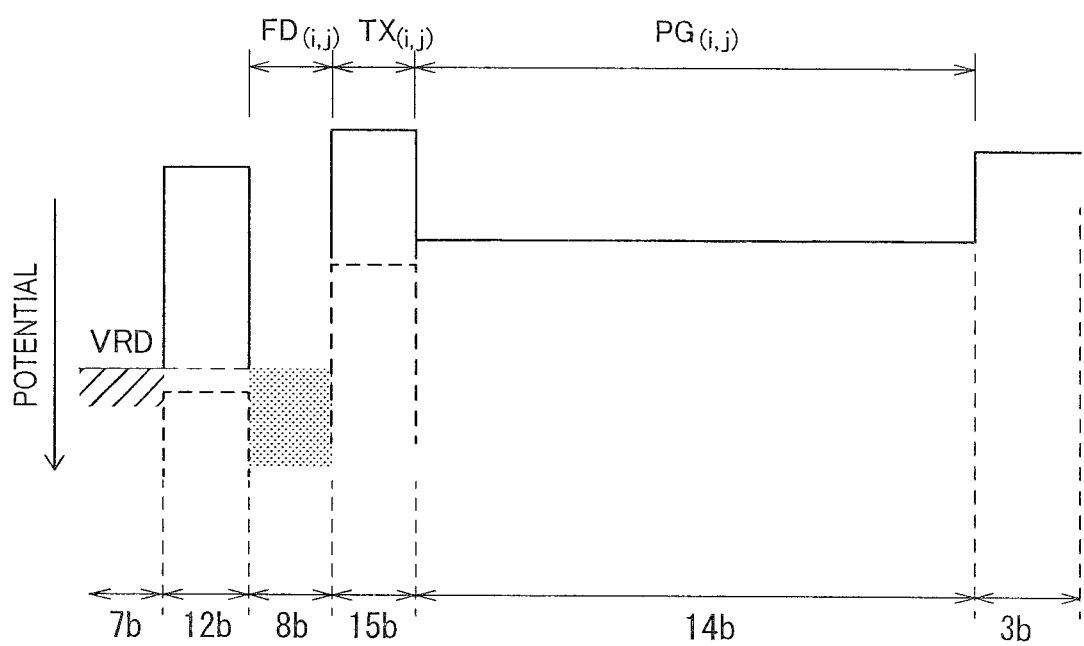
FIG. 17 is a potential profile illustrating an operation of the optical-detection element according to the fourth embodiment.

The n-type buried charge-generation region 5b is isolated from an element-isolation insulating-film 9b via a p-type buried pixel-isolation region 2b, and a p$^+$-type joint-region 3b having a higher impurity concentration than the buried pixel-isolation region 2b is buried in a part of the upper portion of the buried pixel-isolation region 2b. That is, the end portion of the p-type shield region 6b is electrically connected to the p-type buried pixel-isolation region 2b buried at the pixel periphery via the p$^+$-type joint-region 3b. Accordingly, the end portion of the p-type shield region 6b is electrically short-circuited by the p-type supporting-layer 1b via the p$^+$-type joint-region 3b. FIG. 17 is a diagram illustrating a potential distribution of the pixel $Qb_{ij}$ according to the fourth embodiment in cross section corresponding to FIG. 16A.

The transfer-transistor scanner 31 illustrated in FIG. 14 applies, to the transfer-gate electrode 15b in the respective pixels $Qb_{ij}$, a first voltage set at a lower-level voltage for accumulating signal charges generated by photo-electric conversion in the buried charge-generation region 5b, and a second voltage set at a higher-level voltage for transferring the charges accumulated in the buried charge-generation region 5b to the charge-readout region 8b. A voltage VPG of a constant value (DC) approximate to zero volt is applied to the transparent electrode 14b in the respective pixels $Qb_{ij}$ so that the surface potential of the p-type shield region 6b is pinned by majority carriers (holes).

Figure 18:
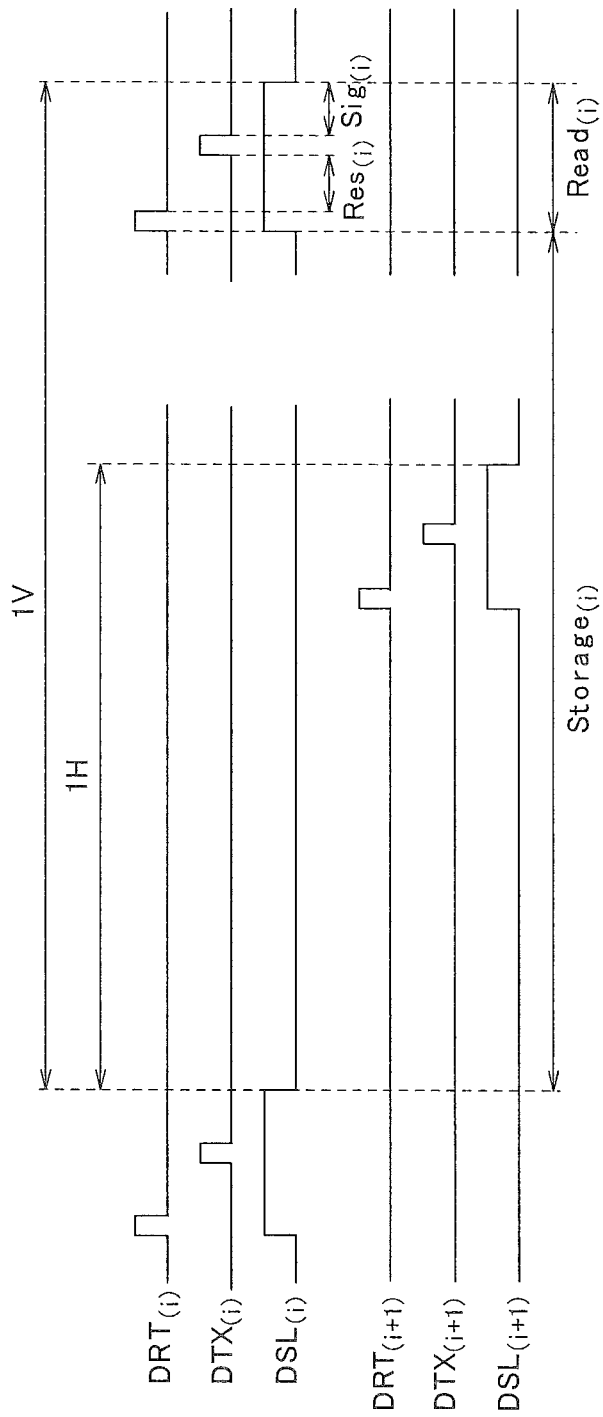
FIG. 18 is a chart for describing a drive timing of the photogate image sensor according to the fourth embodiment.

FIG. 18 is a timing chart illustrating a drive timing, focusing on the transfer drive-lines $DTX_{(i)}$ and $DTX_{(i+1)}$, the reset drive-lines $DRT_{(i)}$ and $DRT_{(i+1)}$, and the selection drive-lines $DSL_{(i)}$ and $DSL_{(i+1)}$ in the i-th and (i+1)-th rows, among the drive-lines extending in the horizontal direction in FIG. 14. The symbol "1H" represents a row-readout period, and the symbol "1V" represents a frame-readout period, on the assumption that the readout operation is carried out in order of row.

In the pixel $Qb_{ij}$ in the i-th row, the photo-electric conversion and storage operation, in which the selection-gate signal $DSL_{(i)}$ is set at a lower-level voltage to separate the pixel from the signal-line, is carried out in the storage period Storage(i). Simultaneously, in the storage period Storage(i), the transfer-gate signal DTX(i) is set at a lower-level voltage so as to carry out the photo-electric conversion and storage operation. When the signal charges are accumulated in the photogate $PG_{(i, j)}$, the voltage VPG of the constant value (DC) approximate to zero volt is applied to the transparent electrode 14b so that the surface potential of the p-type shield region 6b is pinned by majority carriers (holes), as in the case illustrated in FIG. 5.

The selection-gate signal DSL(i) is sifted to a higher-level voltage so that the pixel is read out to the signal-line in the readout period Read(i), and a reset-gate signal DRT(i) is shifted to the higher-level voltage at the beginning of the readout period Read(i) to read out the signal Res(i). Subsequently, the transfer-gate signal DTX(i) is shifted to the higher-level voltage at the intermediate stage of the readout period Read(i), and the signal Sig(i) is read out immediately after the transfer-gate signal DTX(i) is shifted to the higher-level voltage. The signals are then subjected to correlated double sampling (CDS) in the readout circuit 34 which reads a difference between the signal $Res_{(i)}$ at the reset level and the signal $Sig_{(i)}$ of the signal charges accumulated, so as to obtain net signals in which reset noise as well as threshold variation of the amplification-transistor $SF_{(i, j)}$ is removed.

Figure 19A:
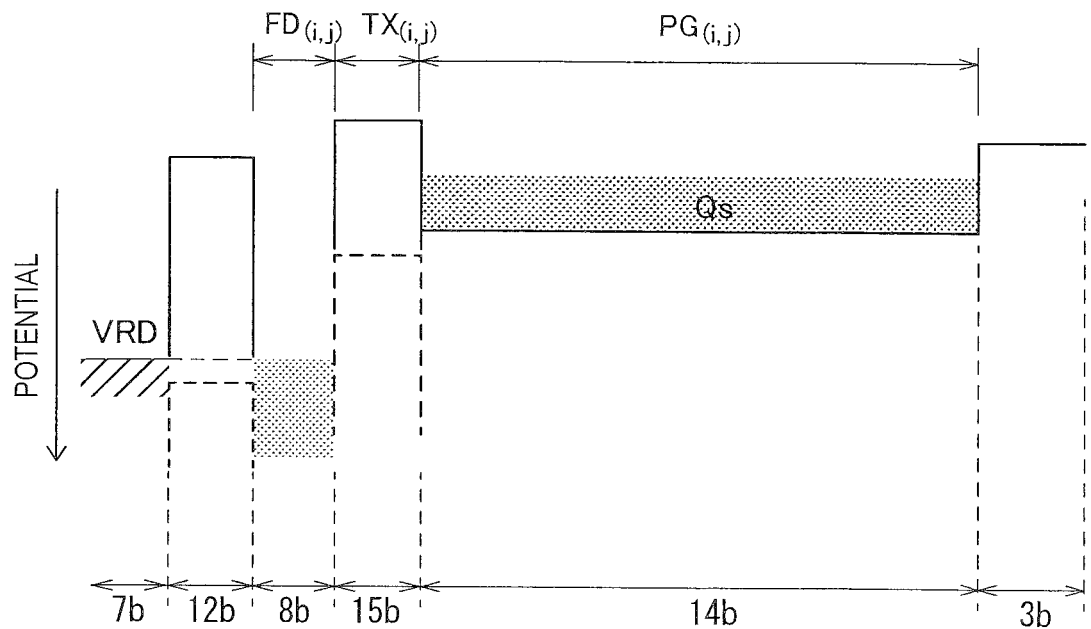
FIG. 19A is a diagram for describing a potential profile during charge storage in the optical-detection element according to the fourth embodiment.
Figure 19B:
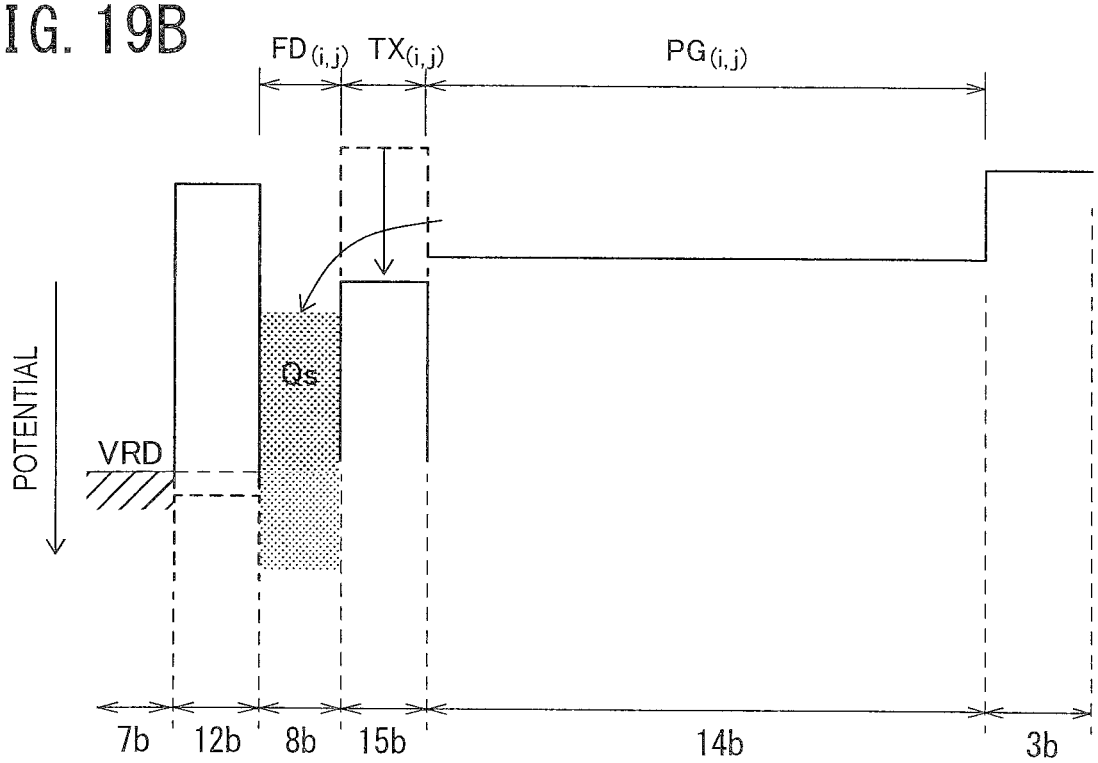
FIG. 19B is a diagram for describing a potential profile during reset and signal detection in the optical-detection element according to the fourth embodiment.

As illustrated in FIG. 19A, the voltage applied to the transfer-gate electrode 15i is shifted to a lower-level voltage during the photo-electric conversion, and the signal charges generated by the photo-electric conversion are accumulated in the buried charge-generation region 5b. As illustrated in FIG. 19B, the voltage applied to the transfer-gate electrode 15b is shifted to the higher-level voltage during the charge transfer, and the charges accumulated in the buried charge-generation region 5b are transferred to the charge-readout region 8b.

In the photogate image sensor according to the fourth embodiment, the voltage approximate to zero volt is applied to the gate of the photogate $PG_{(i, j)}$ so that the potential is pinned while the charge-detection margin is ensured, so as to suppress a generation of a dark current, as in the case of the first to third embodiments.

A structure in which the transparent electrode 14b is not provided on the upper surface of the shield region 6b in the pixel $Qb_{ij}$ according to the fourth embodiment illustrated in FIGS. 15, 16A, and 16B, is known as "a buried photodiode structure". As in the case of the pixel $Qb_{ij}$ according to the fourth embodiment, the specific structure characterized in that the transparent electrode 14b is provided on the upper surface of the shield region 6b via the gate insulating-film 4b is not preferably applied to a generic image sensor used under normal conditions, because polysilicon typically used for an electrode material tends to absorb a shorter wavelength light such as blue light to degrade color reproducibility. In addition, as described in the first embodiment, the shield region 6b itself is occasionally referred to as "a virtual electrode", and an arrangement of a transparent electrode on such a virtual electrode does not follow the conventional technical common knowledge in the art. Further, when the transparent electrode 14b is provided, another problem with the gap d provided between the transfer-gate electrode 15 and the transparent electrode 14b is brought up upon processing. In contrast, although the light sensitivity for the shorter wavelength is reduced, the pixel $Qb_{ij}$ of the fourth embodiment can prevent from the depletion in the surface of the shield region 6b caused by radiation. That is, the pixel $Qb_{ij}$ of the fourth embodiment can solve the problem of earlier technology, such that the dark current suddenly and greatly increases by radiation, ascribable to the depletion in the surface of the shield region 6b by the radiation. Because the object of the pixel $Qb_{ij}$ of the fourth embodiment is addressing to obtain a very high radiation immunity, while solving the technical problem upon processing of the gap due to the specific structure in which the transparent electrode 14b is provided above the shield region 6b. Therefore, the pixel $Qb_{ij}$ according to the fourth embodiment can ensure the high radiation immunity, achieving the significant effectiveness.

Fifth Embodiment

As described above, each of the shield regions 6, 6a, and 6b as described in the first to fourth embodiments is occasionally referred to as "the virtual electrode" in an optical-detection element having a structure other than the photogate structure, and the arrangement of the transparent electrode 14, 14a, or 14b on such the virtual electrode does not follow the conventional technical common knowledge in the art. Thus, conventionally, the arrangement of the p-type shield region 6, 6a, or 6b on the upper surface of the buried charge-generation region 5, 5a, or 5b was considered an inappropriate scheme for the photogate structure.

Before arriving at the invention as described in the first to fourth embodiments, the inventors of the present invention had tried to find a solution to the problem of a significantly strong electric field caused at the boundary between the photogate and the charge-readout region 8, 8a, or 8b in a structure not including the shield region 6, 6a, or 6b by devising a design of the photogate scanner 21 as a peripheral circuit. A photogate image sensor according to a fifth embodiment includes a pixel area in which a plurality of photogate-pixels $Qc_{ij}$ is arranged in a matrix form, and a peripheral circuit having the photogate scanner 21, the reset-transistor scanner 22, the select-transistor scanner 23, and the like disposed at the periphery of the pixel area, as in the case of the photogate image sensor pertaining to the second embodiment illustrated in FIG. 9.

Figure 20:
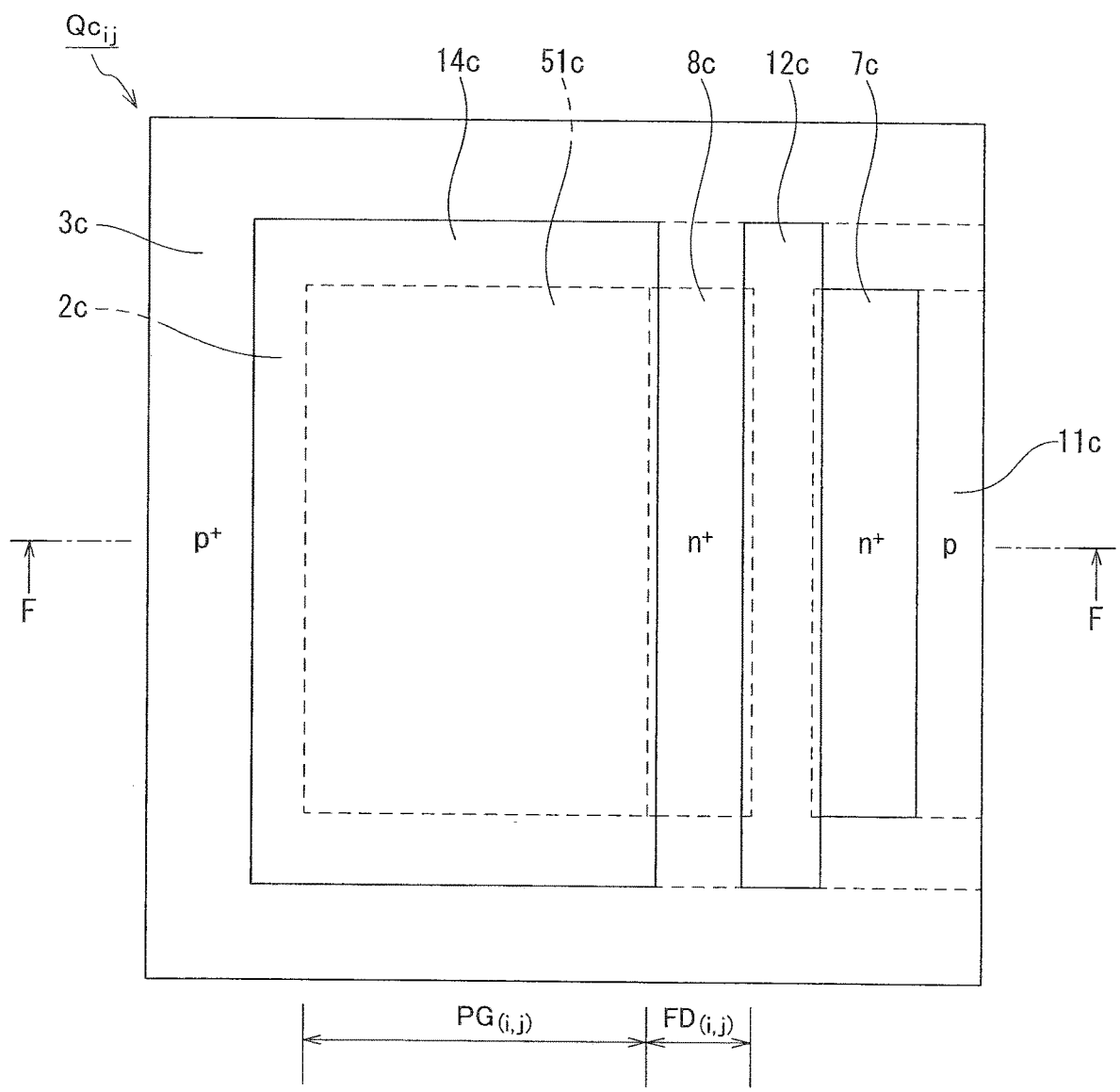
FIG. 20 is a schematic plan view illustrating an optical-detection element of one pixel included in a photogate image sensor according to a fifth embodiment of the present invention.
Figure 21:
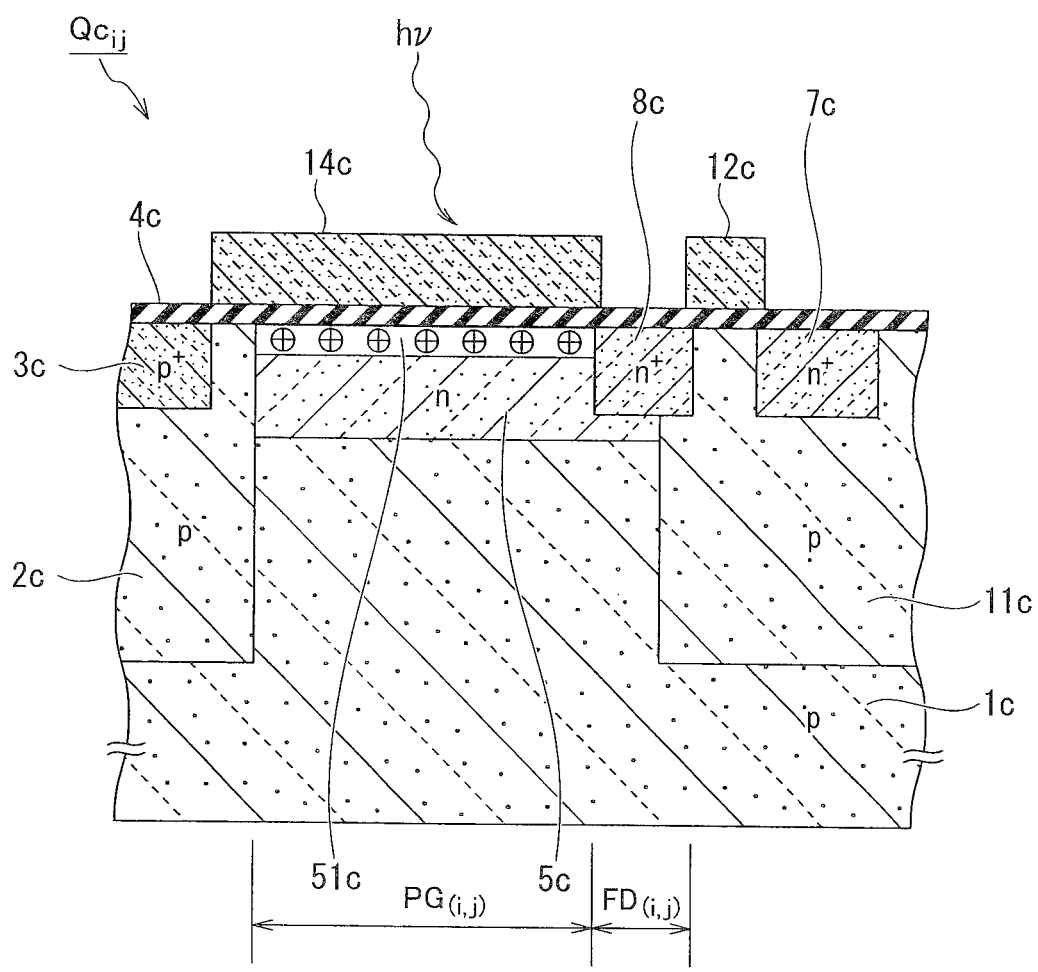
FIG. 21 is a cross-sectional view of the optical-detection element taken from the direction F-F in FIG. 20.

As illustrated in FIGS. 20 and 21, the pixel $Qc_{ij}$ according to the fifth embodiment includes a photogate $PG_{(i,j)}$ including a p-type supporting-layer 1c, an n-type buried charge-generation region 5c buried in an upper portion of the supporting-layer 1c, a gate insulating-film 4c contacted with the buried charge-generation region 5c, and a transparent electrode 14c provided on the gate insulating-film 4c, and an n-type charge-readout region 8c having a higher impurity concentration than the buried charge-generation region 5c and connected to the buried charge-generation region 5c. The pixel $Qc_{ij}$ according to the fifth embodiment differs from the pixel $Q_{ij}$ pertaining to the first embodiment in excluding the shield region 6, which is provided in the upper portion of the buried charge-generation region 5 and in contact with the gate insulating-film 4 in the pixel $Q_{ij}$ illustrated in FIGS. 2, 3A, and 3B. The photogate $PG_{(i,j)}$ in the pixel $Qc_{ij}$ according to the fifth embodiment is implemented by a region in which the transparent electrode 14c is allocated immediately above the buried charge-generation region 5c via the thin gate insulating-film 4c.

Figure 23:
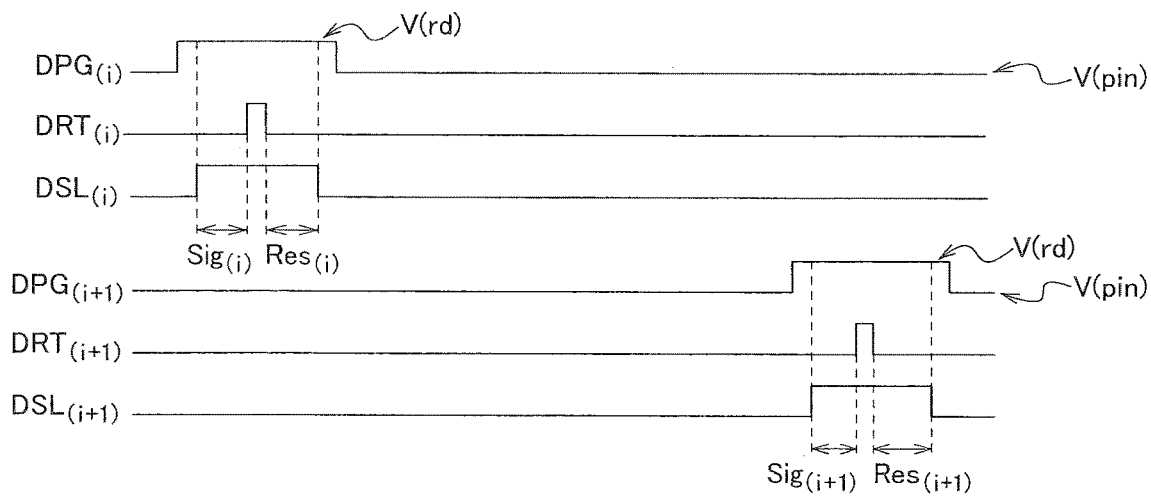
FIG. 23 is a chart for describing a drive timing of the photogate image sensor according to the fifth embodiment.

The photogate scanner 21 illustrated in FIG. 9 applies, to the transparent electrode 14c of the respective pixels $Qc_{ij}$ illustrated in FIGS. 20 and 21, a first voltage at which the surface potential at the interface between the buried charge-generation region 5c and the gate insulating-film 4c is pinned by minority carriers in the buried charge-generation region 5c and a second voltage shifted from the first voltage in a direction in which the channel potential of the buried charge-generation region 5c deepens. In particular, according to the timing chart as illustrated in FIG. 23, the photogate scanner 21 divides one frame into a "storage period" and a "readout period", and applies, to the transparent electrode 14c of the respective pixels $Qc_{ij}$, the first voltage in the storage period and the second voltage in the readout period.

In the pixel $Qc_{ij}$, signal charges generated in the storage period due to photo-electric conversion in the photogate $PG_{(i,j)}$ is read out from the charge-readout region 8c in the readout period. In the pixel $Qc_{ij}$ according to the fifth embodiment, as illustrated in FIG. 21, when the first voltage is applied to the transparent electrode 14c in the storage period, an inversion layer 51c is induced by holes of minority carriers immediately below the gate insulating-film 4c.

As described above, when gamma rays are irradiated to the semiconductor element, a large number of electron-hole pairs are generated in the oxide film on the semiconductor surface, and positive charges concentrate in the oxide film on the semiconductor surface. As a result, the semiconductor surface is depleted to cause a large dark current. In the pixel $Qc_{ij}$ according to the fifth embodiment, since the buried charge-generation region 5c is the n-type, the inversion layer 51c is induced by a large number of holes on the surface of the buried charge-generation region 5c immediately below the transparent electrode 14c in the storage period. Since the surface potential of the buried charge-generation region 5c is pinned by the holes in the storage period, the interface states at the interface between the gate insulating-film 4c and the buried charge-generation region 5c are deactivated. As illustrated in FIG. 21, since the thin gate insulating-film 4c is only provided above the buried charge-generation region 5c in the photogate structure according to the fifth embodiment, an absolute quantity of the holes generated in the gate insulating-film 4c is small. Accordingly, the pixel $Qc_{ij}$ according to the fifth embodiment can greatly improve the radiation immunity in association with the deactivation of the interface states described above, as in the case of the pixels $Q_{ij}$, $Qa_{ij}$, and $Qb_{ij}$ according to the first to fourth embodiments.

As illustrated in FIG. 20, the pixel $Qc_{ij}$ according to the fifth embodiment may be designed to have a rectangular shape in a planar pattern, for example. FIG. 20 illustrates an upper surface of the pixel $Qc_{ij}$, while the illustration of the gate insulating-film 4c is omitted. The FIG. 20 omits the amplification-transistor $SF_{(i,j)}$ and the select-transistor $SL_{(i,j)}$ illustrated in FIG. 9. Although a part of a p-type buried pixel-isolation region 2c is exposed on the left side in cross section illustrated in FIG. 21, the buried pixel-isolation region 2c is buried in the upper portion of the supporting-layer 1c at the periphery of the pixel $Qc_{ij}$, as illustrated in FIG. 20. A p-type joint-region 3c having a higher impurity concentration than the buried pixel-isolation region 2c is buried in a part of the upper portion of the buried pixel-isolation region 2c and in contact with the gate insulating-film 4c so as to surround the pixel $Qc_{ij}$.

As illustrated on the right side in FIGS. 20 and 21, a p-type well region 11c is buried in the upper portion of the supporting-layer 1c in the pixel $Qc_{ij}$ at the same depth as the buried pixel-isolation region 2c. An n-type reset-drain region 7c having a higher impurity concentration than the buried charge-generation region 5c is buried in a part of an upper portion of the well region 11c and in contact with the gate insulating-film 4c. In general, the p-type well region 11c and the p-type buried pixel-isolation region 2c are buried as a common region.

The n-type charge-readout region 8c having a higher impurity concentration than the buried charge-generation region 5c is buried between the well region 11c and the buried charge-generation region 5c and in contact with the gate insulating-film 4c. A reset-gate electrode 12c is stacked on the gate insulating-film 4c and allocated above the well region 11c between the reset-drain region 7c and the charge-readout region 8c so as to implement a reset-transistor $RT_{(i,j)}$ having a structure equivalent to an nMOS transistor. The higher-level voltage is applied to the reset-gate electrode 12c in the reset-transistor $RT_{(i,j)}$ to exhaust charges of the charge-readout region 8c to the reset-drain region 7c.

In the storage period in the photogate image sensor according to the fifth embodiment, the first voltage $V_{(pin)}$ applied to the photogate $PG_{(i,j)}$ is set at approximately −1 volt to −2 volts according to the one-dimensional calculation as described in the photogate image sensor pertaining to the second embodiment. At the beginning of the storage period, the potential difference between the voltage of the charge-detection portion $FD_{(i,j)}$ and the photogate voltage VPG is kept the value at the readout period as described above, and the potential of the charge-detection portion $FD_{(i,j)}$ is further decreased in association with the subsequent accumulation of the signal charges. The second voltage $V_{(rd)}$ and the first voltage $V_{(pin)}$ may be other values at which the charge-detection margin can be ensured during the readout operation, and the pinning operation can be implemented during the storage operation, other than the values as described above.

Figure 22:
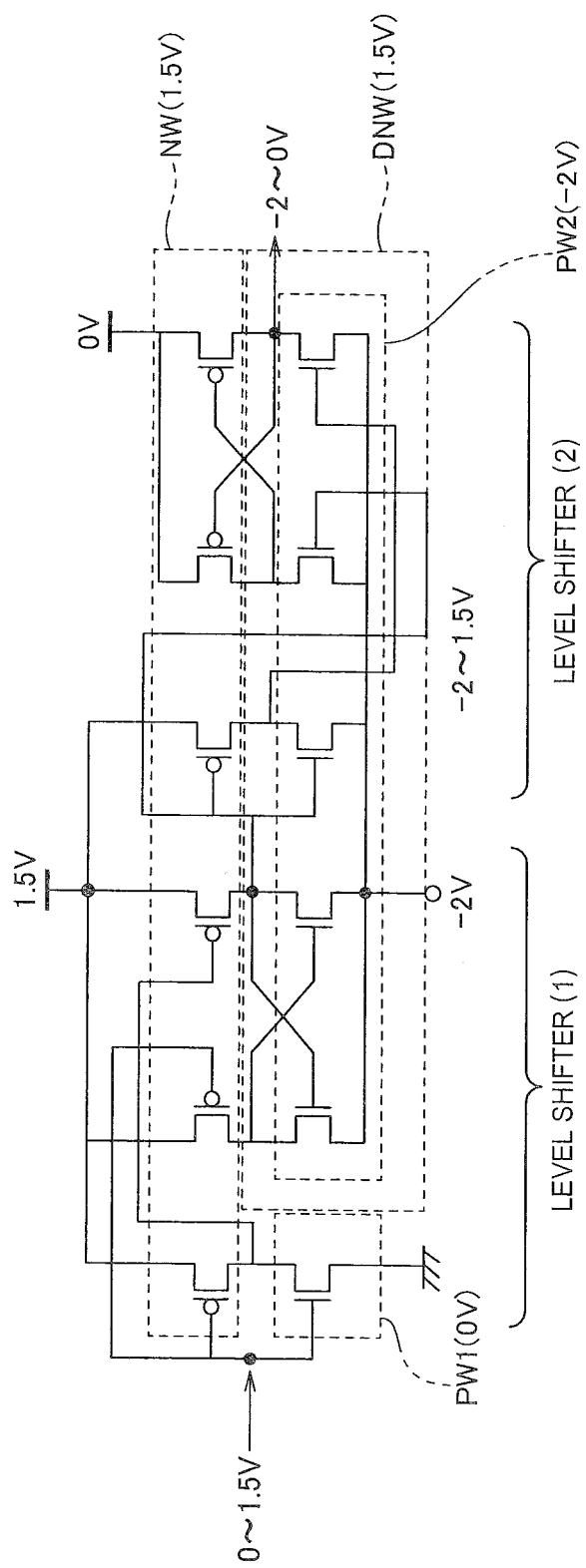
FIG. 22 is a circuit diagram illustrating level shifters for generating a first voltage and a second voltage of a photogate scanner in the photogate image sensor according to the fifth embodiment.

Both of the first voltage $V_{(pin)}$ and the second voltage $V_{(rd)}$, which are transmitted from the photogate scanner 21, can be generated in a stepwise shift by use of conventionally-known level shifters. The level shifters included in the photogate scanner 21 can be implemented by a logic circuit in which a plurality of nMOS transistors and pMOS transistors are combined, as illustrated in FIG. 22. The circuit in FIG. 22 is illustrated with a case of generating the second voltage $V_{(rd)}$ set at zero volt and the first voltage $V_{(pin)}$ set at −2 volts.

When a pulse in which a lower-level voltage is zero volt and the higher-level voltage is 1.5 volts is entered to the input side of the circuit on the left side as illustrated in FIG. 22, for example, the level shifter (1) shifts the lower-level input voltage from zero volt to −2 volts, so that a pulse in which the lower-level voltage is the first voltage $V_{(pin)}$ can be transferred to the output side of the circuit on the right side as illustrated in FIG. 22. The voltage on the higher-level voltage side remains 1.5 volts at this stage. Subsequently, the level shifter (2) shifts the higher-level input voltage from 1.5 volts to zero volt, so as to transmit a pulse in which the higher-level voltage is the second voltage $V_{(rd)}$ while the lower-level voltage side remain the first voltage $V_{(pin)}$.

In the lower half region on the nMOS transistor side in the circuit illustrated in FIG. 22, a first p-well region PW1 on the preceding side and a second p-well region PW2 on the following side are aligned in the lateral direction. Since the second p-well region PW2 is −2 volts while the first p-well region PW1 is zero volt, a deep n-well region DNW is provided between the nMOS transistor and a p-type substrate having a ground voltage of zero volt. In the upper half region on the pMOS transistor side in the circuit illustrated in FIG. 22, a normal n-well region NW corresponding to 1.5 volts is provided.

FIG. 23 is a timing chart illustrating a drive timing focusing on the photogate drive-lines $DPG_{(i)}$ and $DPG_{(i+1)}$, the reset drive-lines $DRT_{(i)}$ and $DRT_{(i+1)}$, and the selection drive-lines $DSL_{(i)}$, and $DSL_{(i+1)}$ in the i-th and (i+1)-th rows, among the drive-lines extending in the horizontal direction in FIG. 9. First, in the pixel $Qc_{ij}$ in the i-th row, the selection drive-line $DSL_{(i)}$ of the select-transistor scanner 23 is shifted to the higher-level voltage in the readout period so that the pixel signal is read out to the output line. The photogate drive-line $DPG_{(i)}$ of the photogate scanner 21 is shifted to the higher-level voltage slightly before the readout operation, and the reset drive-line $DRT_{(i)}$ of the reset-transistor scanner 22 is shifted to the higher-level voltage at the intermediate stage of the readout period, so that the charge-readout region 8c is reset.

Immediately before the reset operation, a signal $Sig_{(i)}$ of the signal charges having been accumulated in the charge-detection portion $FD_{(i,j)}$ is read out from the charge-readout region 8c. Immediately after the reset operation, a signal $Res_{(j)}$ at the reset level in which the signal charges of the charge-detection portion $FD_{(i,j)}$ are exhausted is read out from the charge-readout region 8c. The signals are then subjected to correlated double sampling (CDS) in the readout circuit 24 which reads a difference between the signal $Sig_{(i)}$ of the signal charges accumulated and the signal $Res_{(i)}$ at the reset level, so as to obtain net signals.

The readout period is changed to the storage period after the readout operation, and the photogate drive-line $DPG_{(i)}$ of the photogate scanner 21 is changed to a value at a lower-level voltage at which the potential of the photogate $PG_{(i,j)}$ is pinned. FIG. 25 is a diagram illustrating a potential profile in a case in which a negative potential as the photogate voltage VPG is applied to the transparent electrode 14c in the pixel $Qc_{ij}$ according to the fifth embodiment in the storage period, and the surface potential of the photogate $PG_{(i,j)}$ is pinned. The inversion layer 51c below the photogate $PG_{(i,j)}$ is in the pinned state in the storage period, so as to suppress a generation of a dark current at the surface and improve the radiation immunity. The portion having the deepest potential in the buried charge-generation region 5c serves as a channel 52c.

The charge-readout region 8c of the charge-detection portion $FD_{(i,j)}$ is in the floating state during the period other than the period in which the reset drive-line $DRT_{(i)}$ of the reset-transistor scanner 22 is at the higher-level voltage in the readout period. Therefore, when the photogate drive-line $DPG_{(i)}$ of the photogate scanner 21 is shifted from the higher-level voltage in the readout period to the lower-level voltage in the storage period, the voltage level of the charge-readout region 5c is also shifted to the lower-level voltage. Accordingly, the potential difference between the charge-detection portion $FD_{(i,j)}$ and the charge-readout region 8c remains a small value, so as to prevent electric field concentration and suppress a generation of a dark current. The timing at which the photogate drive-line $DPG_{(i)}$ is shifted between the first voltage $V_{(pin)}$ and the second voltage $V_{(rd)}$ is preferably in a period in which the selection drive-line $DSL_{(i)}$ is in an off state (at the lower-level voltage), as illustrated in FIG. 23, in order to prevent such a shift from having an influence on the signal-line.

Subsequently, the pixel $Qc_{ij}$ in the (i+1)th row is driven in the same manner as in the i-th row per horizontal scanning period in the time direction. Similarly, the same operation as in the i-th row is repeated sequentially in the (i+2)th row, the (i+3)th row, . . . per horizontal scanning period in the time direction, so as to carry out the readout operation for the entire pixel area in the photogate image sensor. The potential difference between the charge-readout region 5c and photogate $PG_{(i,j)}$ is kept at a small value in each row, so as to prevent electric field concentration.

Figure 24A:
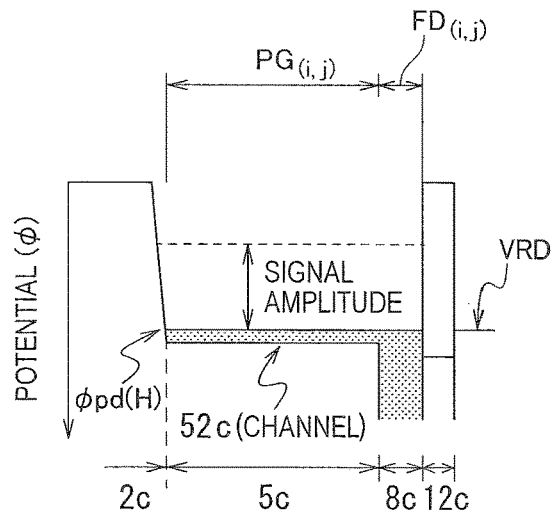
FIG. 24A is a diagram for describing a potential profile during reset and signal detection in the optical-detection element according to the fifth embodiment.

A change in the potential state of the respective pixels $Qc_{ij}$ in each of the readout period during the reset operation and the signal detection operation and the storage period during the photo-electric conversion and storage operation is described below with reference to FIG. 24. As illustrated in FIG. 24A, the voltage of the transparent electrode 14c of the photogate $PG_{(i,j)}$ is relatively high and the potential is deep during the readout period in which the signal is detected and read out. When the reset-transistor $RT_{(i,j)}$ is turned on, the potentials of the charge-detection portion $FD_{(i,j)}$ and the channel 52c generated in the buried charge-generation region 5c below the photogate $PG_{(i,j)}$, are reset to a deep level Φpd (H) When the gate voltage of the photogate $PG_{(i,j)}$ and the reset-drain voltage VRD of the reset-transistor $RT_{(i,j)}$ are set as appropriate values at an appropriate timing, the charges are also accumulated in the channel 52c below the photogate $PG_{(i,j)}$. The reset-transistor $RT_{(i,j)}$ is then turned off, so that the charges of the charge-detection portion $FD_{(i,j)}$ and the channel 52c below the photogate $PG_{(i,j)}$ are changed to a floating state. Although the following is the case in which the charges are also accumulated in the channel 52c below the photogate $PG_{(i,j)}$, the present invention can be applicable to a case in which the charges are accumulated only in the charge-detection portion $FD_{(i,j)}$.

Figure 24B:
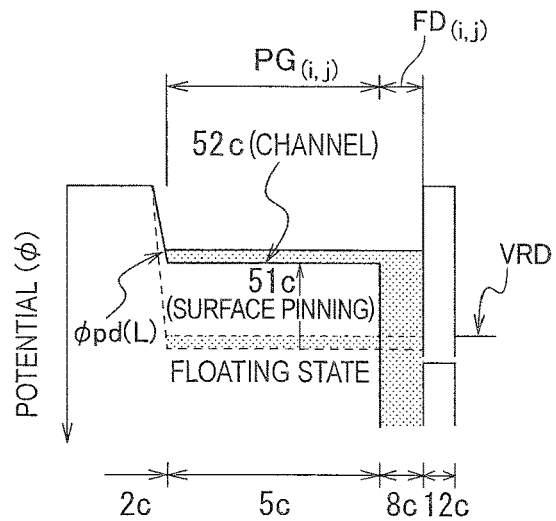
FIG. 24B is a diagram for describing a potential profile during charge storage in the optical-detection element according to the fifth embodiment.

Subsequently, the photogate voltage VPG applied to the transparent electrode 14c of the photogate $PG_{(i,j)}$ is then shifted to a lower-level voltage until the inversion layer 51c induced at the surface of the buried charge-generation region 5c is pinned to be covered with holes. The pixel $Qc_{ij}$ is then shifted to the photo-electric conversion and storage operation. As illustrated in FIG. 24B, in the storage period in which the signal charges are accumulated, since the charges accumulated in the charge-detection portion $FD_{(i,j)}$ and the channel 52c below the photogate $PG_{(i,j)}$ are in the floating state, the potential of the channel 52c is shifted to a relatively shallow level Φpd (L) in association with the potential change in the gate voltage of the photogate $PG_{(i,j)}$ due to the capacitive coupling between the photogate $PG_{(i,j)}$ and the channel 52c and the charge-detection portion $FD_{(i,j)}$. Although not illustrated in FIG. 24B, when the charges are accumulated only in the charge-detection portion $FD_{(i,j)}$, the potential of the charge-detection portion $FD_{(i,j)}$ can be shifted to a lower potential due to the capacitive coupling between the photogate $PG_{(i,j)}$ and the charge-detection portion $FD_{i,j}$.

Since the potential difference between the charge-detection portion $FD_{(i,j)}$ and the photogate $PG_{(i,j)}$ can remain small, a dark current caused at the surface of the channel 52c below the photogate $PG_{(i,j)}$ derived from the pinning state is suppressed, and a dark current due to electric field concentration is also suppressed during the photo-electric conversion and storage operation. The signal is read out at the beginning of the subsequent readout period and immediately before the reset operation. That is, the potential returns to the state illustrated in FIG. 24A, so as to obtain the net signal amount from the shift amount of the potential shifted from the reset level Φpd (H) due to the signal charges.

In the pixel $Qc_{ij}$ according to the fifth embodiment, the photogate voltage VPG is varied, and the photogate voltage VPG is set at the higher-level voltage during the readout period. Further; the voltage at the reset level is set at the higher-level voltage to reset the charge-readout region 8c, so as to shift the charge-readout region 8c to a high potential. Accordingly, while the shield field 6, 6a, or 6b described in the first to fourth embodiments is excluded in the pixel $Qc_{ij}$, the charge-detection margin can be ensured, the potential difference between the photogate $PG_{(i,j)}$ and the charge-detection portion $FD_{(i,j)}$ can be decreased, electric field concentration during the readout period can be prevented, and an excessive dark current generated during the readout period can be suppressed.

The potential of the charge-readout region 8c after the reset operation in the readout period is finished is in the floating state. When the photogate voltage VPG is shifted to a lower-level voltage capable of the pinning operation after the readout period, the potential of the charge-readout region 8c is also shifted to a low potential. That is, the pinning operation is carried out in the photogate $PG_{(i,j)}$ during the photo-electric conversion and storage operation after the readout period, and the potential difference between the photogate $PG_{(i,j)}$ and the charge-detection portion $FD_{(i,j)}$ results in a small value. Accordingly, a dark current generated during the photo-electric conversion and storage operation can greatly be reduced.

The photogate image sensor according to the fifth embodiment does not include the shield field 6, 6a, or 6b illustrated in the first to fourth embodiments, but uses the photogate scanner 21 to divide one frame into the two periods so as to prevent electric field concentration in the charge-detection portion $FD_{(i,j)}$ to suppress a generation of a dark current while the charge-detection margin is ensured even when the negative voltage is applied to the gate of the photogate $PG_{(i,j)}$ for pinning the potential.

Sixth Embodiment

Figure 26:
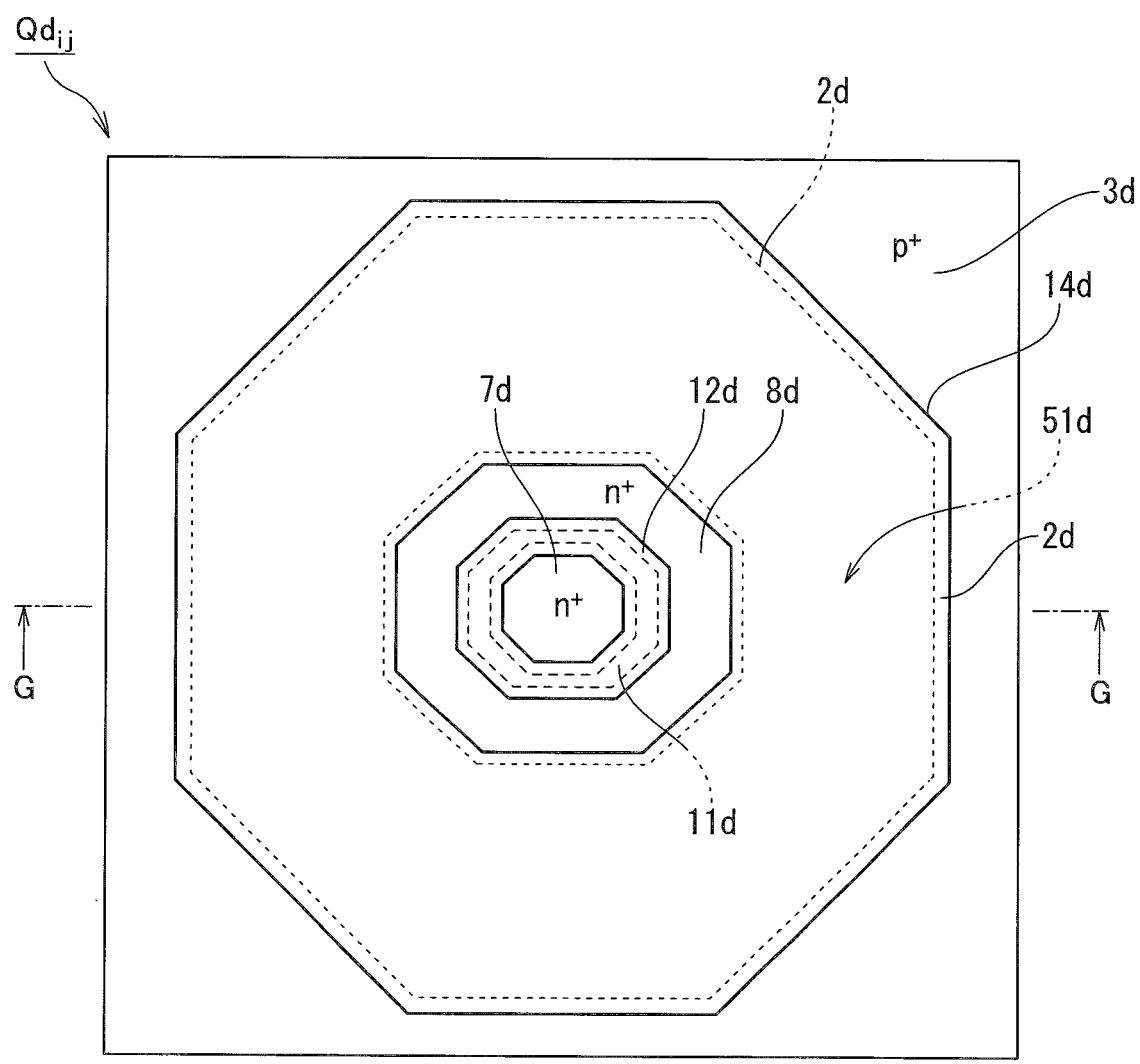
FIG. 26 is a schematic plan view illustrating an optical-detection element of one pixel included in a photogate image sensor according to a sixth embodiment of the present invention.
Figure 27:
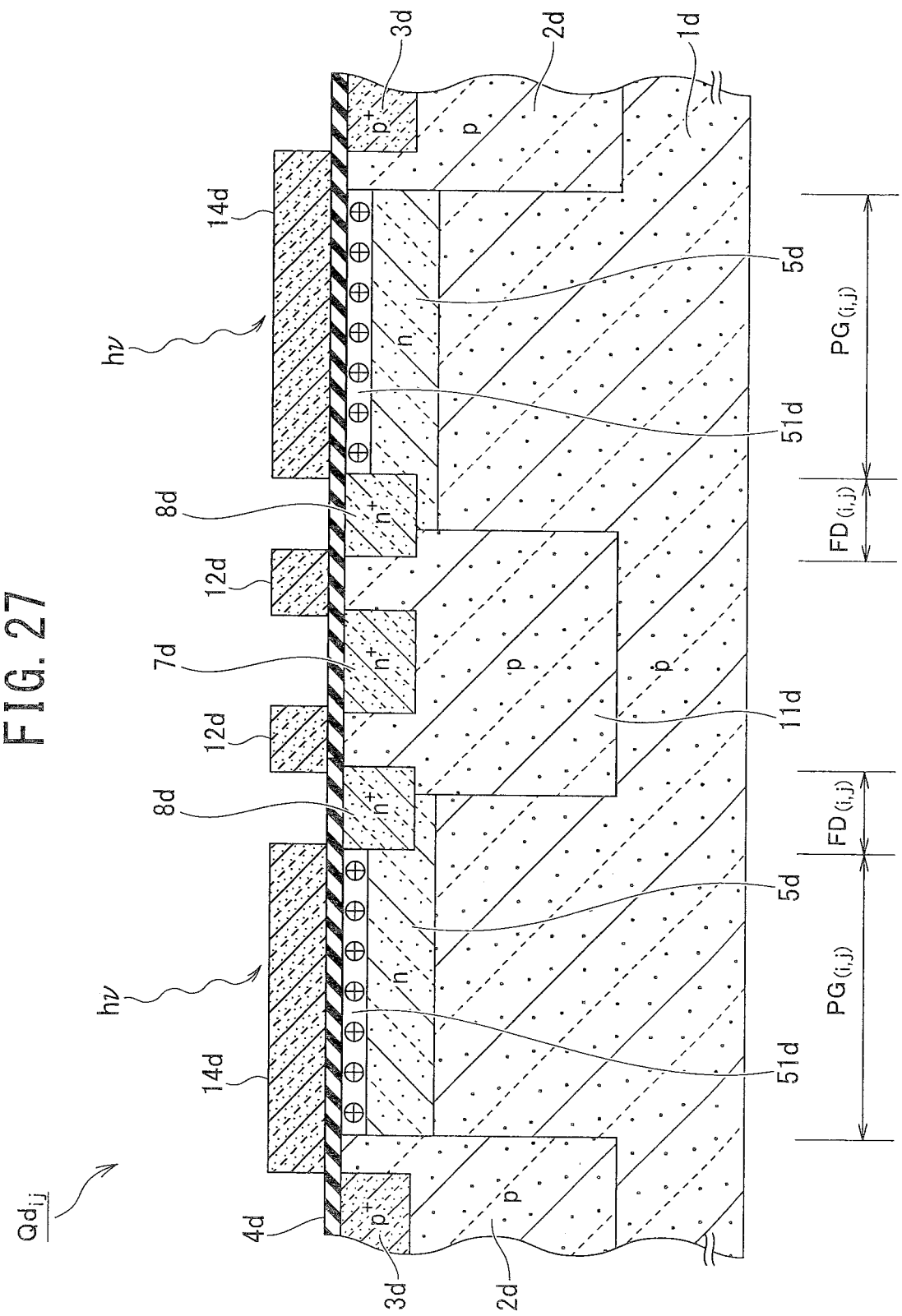
FIG. 27 is a cross-sectional view of the optical-detection element taken from the direction G-G in FIG. 26.

A photogate image sensor according to a sixth embodiment includes a pixel area in which a plurality of photogate-pixels $Qd_{ij}$ is arranged in a matrix form, and a peripheral circuit having the photogate scanner 21, the reset-transistor scanner 22, the select-transistor scanner 23, and the like disposed at the periphery of the pixel area, as in the case of the photogate image sensor pertaining to the second embodiment illustrated in FIG. 9. As illustrated in FIGS. 26 and 27, the photogate image sensor according to the sixth embodiment differs from the photogate image sensor of the fifth embodiment in that the photogate $PG_{(i,j)}$ and the charge-detection portion $FD_{(i,j)}$ are each delineated into an annular form in a planar pattern, but has the same structure as the photogate image sensor pertaining to the fifth embodiment not including the shield region 6, 6a, or 6b described in the first to fourth embodiments.

The pixel $Qd_{ij}$ according to the sixth embodiment includes a transparent electrode 14d implementing the photogate $PG_{(i,j)}$, a charge-readout region 8d implementing the charge-detection portion $FD_{(i,j)}$ arranged adjacent to the photogate $PG_{(i,j)}$, and a reset-gate electrode 12d and a reset-drain region 7d serving as a reset-transistor for resetting a potential of the charge-readout region 8d. The pixel $Qd_{ij}$ according to the sixth embodiment further includes an amplification-transistor for amplifying a potential change of the charge-readout region 8d, and a select-transistor for selecting an output of the amplification-transistor, although not illustrated in FIG. 26 or FIG. 27.

As illustrated in FIG. 27, the pixel $Qd_{ij}$ according to the sixth embodiment includes a p-type supporting-layer 1d, and a gate insulating-film 4d contacted with an upper surface of the supporting-layer 1d. An n-type buried charge-generation region 5d is buried in an upper portion of the supporting-layer 1d and in contact with the gate insulating-film 4d. An inversion layer 51d is induced at an upper portion of the buried charge-generation region 5d. A transparent electrode 14d delineated into an annular form in a planar pattern is deposited on the gate insulating-film 4d and allocated above the buried charge-generation region 5d.

As illustrated in FIG. 26, the pixel $Qd_{ij}$ according to the sixth embodiment has a rectangular shape in a planar pattern, and the annular photogate $PG_{(i,j)}$ is arranged in the rectangular pixel $Qd_{ij}$. FIG. 26 illustrates the upper surface of the pixel $Qd_{ij}$, while the illustration of the gate insulating-film 4d is omitted. As illustrated in FIG. 27, a p-type buried pixel-isolation region 2d is buried in the upper portion on the peripheral side of the supporting-layer 1d in the pixel $Qd_{ij}$. A p-type joint-region 3d having a higher impurity concentration than the buried pixel-isolation region 2d is buried in a part of an upper portion of the buried pixel-isolation region 2d and in contact with the gate insulating-film 4d to serve as a channel-stop region.

A p-type well region 11d is buried in the upper portion at a central area of the supporting-layer 1d in the pixel $Qd_{ij}$ at the same depth as the buried pixel-isolation region 2d. The n-type reset-drain region 7d having a higher impurity concentration than the buried charge-generation region 5d is buried in a part of an upper portion at a central area of the well-region 11d and in contact with the gate insulating-film 4d. The n-type charge-readout region 8d having a higher impurity concentration than the buried charge-generation region 5d is buried in the region across a part of the upper portion of the well region 11d and a part of the upper portion of the buried charge-generation region 5d and in contact with the gate insulating-film 4d. The p-type well region 11d and the p-type buried pixel-isolation region 2d may be buried as a common region.

The reset-gate electrode 12d delineated into an annular form in a planar pattern is stacked on the gate insulating-film 4d and allocated above the well region 11d between the reset-drain region 7d and the charge-readout region 8d. The structures of the layers or regions in the photogate image sensor according to the sixth embodiment are identical to the structures of the layers or regions denoted by the same reference numerals in the photogate image sensor pertaining to the fifth embodiment, and overlapping explanations thereof are thus not repeated below.

Figure 28A:
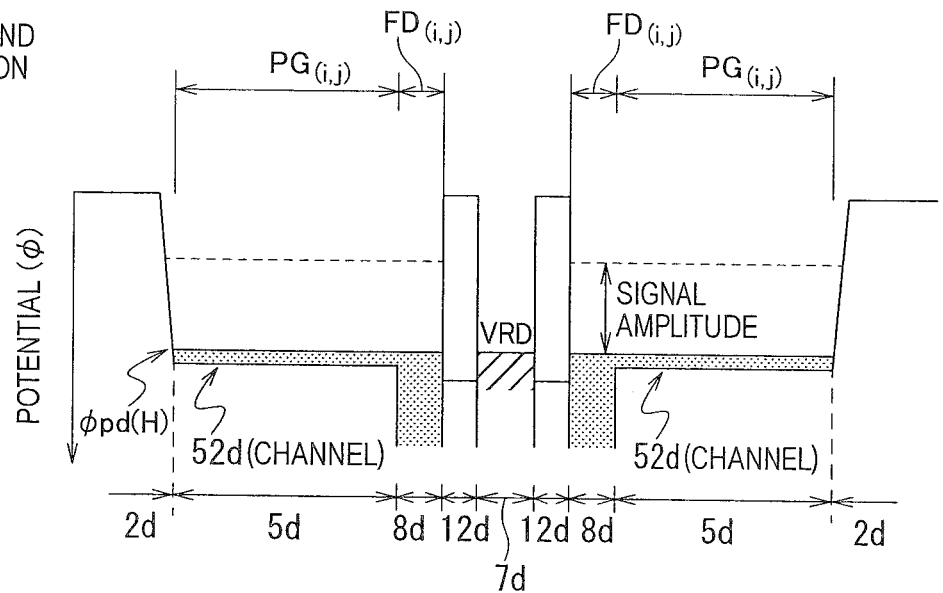
FIG. 28A is a diagram for describing a potential profile during reset and signal detection in the optical-detection element according to the sixth embodiment.

The operations of the photogate image sensor according to the sixth embodiment are similar to the operations of the photogate image sensor pertaining to the fifth embodiment as described with reference to FIG. 23. As illustrated in FIG. 28A, in the pixel $Qd_{ij}$ according to the sixth embodiment, the voltage of the transparent electrode 14d of the photogate $PG_{(i,j)}$ is relatively high and the potential is deep during the readout period in which the signal is detected and read out. When the reset-transistor is turned on, the potentials of the charge-detection portion $FD_{(i,j)}$ and a channel 52d below the photogate $PG_{(i,j)}$ are reset to a deep level Φpd (H), as in the case of the pixel $Qc_{ij}$ according to the fifth embodiment.

The reset-transistor is then turned off, so that the charges of the charge-detection portion $FD_{(i,j)}$ and the channel 52d below the photogate $PG_{(i,j)}$ are changed to a floating state. In the storage period, the photogate voltage VPG applied to the transparent electrode 14d of the photogate $PG_{(i,j)}$ is shifted to a lower-level voltage until the inversion layer 51d induced at the surface of the buried charge-generation region 5d is pinned to be covered with holes, and the pixel $Qd_{ij}$ is then shifted to the photo-electric conversion and storage operation.

Figure 28B:
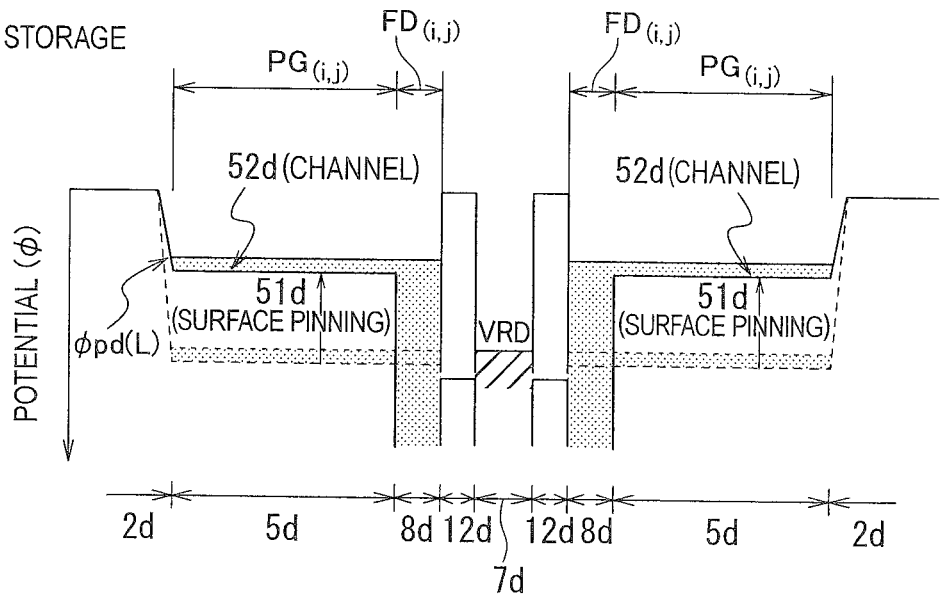
FIG. 28B is a diagram for describing a potential profile during charge storage in the optical-detection element according to the sixth embodiment.

As illustrated in FIG. 28B, in the storage period in which the signal charges are accumulated, the potential of the channel 52d is shifted to a relatively shallow level Φpd (L), and the potential difference between the charge-detection portion $FD_{(i,j)}$ and the photogate $PG_{(i,j)}$ is kept at a small value, as in the case of the pixel $Qc_{ij}$ according to the fifth embodiment. The photogate image sensor according to the sixth embodiment thus can achieve the effectiveness similar to the fifth embodiment, since the photogate image sensor according to the sixth embodiment not including the shield field 6, 6a, or 6b illustrated in the first to fourth embodiments uses the photogate scanner to divide one frame into the two periods, so as to prevent electric field concentration in the charge-detection portion $FD_{(i,j)}$ to suppress a generation of a dark current while the charge-detection margin is ensured even when the negative voltage is applied to the gate of the photogate $PG_{(i,j)}$, for pinning the potential.

Other Embodiments

While the present invention has been described above with reference to the first to sixth embodiments, it should be understood that discussion and Drawings which are incorporated herein are not intended to limit the present invention. Various alternative embodiments, examples, and operational techniques will be apparent to those skilled in the art from the description above.

For example, although the photogate $PG_{(i,j)}$ and the charge-detection portion $FD_{(i,j)}$ each delineated into an annular form in a planar pattern which is substantially octagonal are illustrated in the pixel $Qa_{ij}$ or $Qd_{ij}$ according to the third or sixth embodiment, the annular form may be a tetragonal shape, a hexagonal shape, a decagonal shape, or other polygonal shapes. Alternatively, the annular form may be a circular or elliptic shape.

While the first to sixth embodiments above are illustrated with the case in which the signal charges are electrons and the transistor in the pixel $Qa_{ij}$, $Qb_{ij}$, $Qc_{ij}$, or $Qd_{ij}$ is the n-type, the present invention is not intended to be limited to the case in which the signal charges are electrons. The present invention is also applicable to a case in which the signal charges are holes and the transistor in the pixel $Qa_{ij}$, $Qb_{ij}$, $Qc_{ij}$, or $Qd_{ij}$ is the p-type when the polarity is reversed.

In the description of the first to sixth embodiments, although the two-dimensional photogate image sensor (area sensor) has been described as an example, the photogate image sensor of the present invention is not intended to be limited to the two-dimensional photogate image sensor only. For example, it can be easily understood from the contents of the disclosure that a one-dimensional photogate image sensor (line sensor) in which the pixels $Q_{ij}$ are one-dimensionally aligned (i=1 or j=1) may be implemented using the array of one line, which is changed from the two-dimensional matrix illustrated in FIG. 1.

Naturally, the present invention includes many other embodiments not described herein. Therefore, the technical scope of the present invention is determined only by the present invention identification matters according to claims reasonable from the foregoing description.

What is claimed is:

1. An optical-detection element comprising:
   a supporting-layer of a first conductivity type;
   a buried charge-generation region of a second conductivity type buried in an upper portion of the supporting-layer to implement a photodiode with the supporting-layer;
   a shield region of the first conductivity type having an impurity concentration higher than the supporting-layer and buried at an upper surface of the buried charge-generation region;
   a gate insulating-film contacted with an upper surface of the shield region;
   a transparent electrode provided on the gate insulating-film just above the buried charge-generation region, configured to implement a photogate structure, through which a light is incident on the buried charge-generation region;
   a well region of the first conductivity type having a higher impurity concentration than the supporting-layer and buried in the upper portion of the supporting-layer; and
   a charge-readout region of the second conductivity type having a higher impurity concentration than the buried charge-generation region and buried in the upper portion of the supporting-layer at an edge of the well region toward the buried charge-generation region,
   wherein the impurity concentration of the shield region is set to a value such that an electrostatic potential at a surface side of the shield region is changeable by a voltage applied to the transparent electrode, and a surface potential of the shield region is pinned by charges of the first conductivity type by the electrostatic potential induced in the shield region.

2. The optical-detection element of claim 1, further comprising:
- a reset-drain region of the second conductivity type having a higher impurity concentration than the buried charge-generation region and buried in an upper portion of the well region separately from the charge-readout region; and
- a reset-gate electrode stacked on the gate insulating-film and allocated above the well region between the charge-readout region and the reset-drain region.

3. The optical-detection element of claim 2, wherein when a voltage is applied to the reset-gate electrode, charges accumulated in the charge-readout region are exhausted to the reset-drain region so as to reset the charge-readout region.

4. The optical-detection element of claim 1, wherein the charge-readout region is in contact with the buried charge-generation region and the shield region.

5. The optical-detection element of claim 1, wherein
- the charge-readout region is separated from the buried charge-generation region and the shield region,
- a transfer-gate electrode is further stacked on the gate insulating-film and allocated above the supporting-layer between the buried charge-generation region and the shield region and the charge-readout region, and
- when a voltage is applied to the transfer-gate electrode, signal charges are transferred from the buried charge-generation region to the charge-readout region.

6. A solid-state imaging device in which a plurality of pixels is arranged, each of the plurality of pixels comprising:
- a supporting-layer of a first conductivity type;
- a buried charge-generation region of a second conductivity type buried in an upper portion of the supporting-layer to implement a photodiode with the supporting-layer;
- a shield region of the first conductivity type having an impurity concentration higher than the supporting-layer and buried at an upper surface of the buried charge-generation region;
- a gate insulating-film contacted with an upper surface of the shield region;
- a transparent electrode provided on the gate insulating-film just above the buried charge-generation region, configured to implement a photogate structure, through which a light is incident on the buried charge-generation region;
- a well region of the first conductivity type having a higher impurity concentration than the supporting-layer and buried in the upper portion of the supporting-layer; and
- a charge-readout region of the second conductivity type having a higher impurity concentration than the buried charge-generation region and buried in the upper portion of the supporting-layer at an edge of the well region toward the buried charge-generation region,
- wherein the impurity concentration of the shield region is set to a value such that an electrostatic potential at a surface side of the shield region is changeable by a voltage applied to the transparent electrode, and a surface potential of the shield region is pinned by charges of the first conductivity type by the electrostatic potential induced in the shield region.

7. The solid-state imaging device of claim 6, wherein each of the plurality of pixels further comprises:
- a reset-drain region of the second conductivity type having a higher impurity concentration than the buried charge-generation region and buried in an upper portion of the well region separately from the charge-readout region; and
- a reset-gate electrode stacked on the gate insulating-film and allocated above the well region between the charge-readout region and the reset-drain region.

8. The solid-state imaging device of claim 7, wherein in each of the plurality of pixels, when a voltage is applied to the reset-gate electrode, charges accumulated in the charge-readout region are exhausted to the reset-drain region so as to reset the charge-readout region.

9. The solid-state imaging device of claim 6, wherein in each of the plurality of pixels, the charge-readout region is in contact with the buried charge-generation region and the shield region.

10. The solid-state imaging device of claim 6, wherein in each of the plurality of pixels,
- the charge-readout region is separated from the buried charge-generation region and the shield region,
- a transfer-gate electrode is further stacked on the gate insulating-film and allocated above the supporting-layer between the buried charge-generation region and the shield region and the charge-readout region, and
- when a voltage is applied to the transfer-gate electrode, signal charges are transferred from the buried charge-generation region to the charge-readout region.

11. The solid-state imaging device of claim 6, further comprising a photogate scanner provided at a periphery of a pixel region in which the plurality of pixels are arranged, and configured to apply, to the transparent electrode in each of the plurality of pixels, a first voltage at which a surface potential at an interface between the shield region and the gate insulating-film is pinned by the charges of the first conductivity type and a second voltage shifted from the first voltage in a direction in which a channel potential of the buried charge-generation region deepens, each of the first voltage and the second voltage being applied at a timing of each of divided periods of one frame.

12. The solid-state imaging device of claim 11, further comprising a reset-transistor scanner provided at the periphery of the pixel region, and configured to apply, to the reset-gate electrode in each of the plurality of pixels, a reset voltage for exhausting charges from the charge-readout region to the reset-drain region so as to reset the charge-readout region in a period in which the second voltage is applied, the charges having polarity shifted in an identical direction in which the second voltage is shifted.

* * * * *